US012804927B2

(12) United States Patent
Yoshikawa

(10) Patent No.: US 12,804,927 B2
(45) Date of Patent: Nov. 17, 2026

(54) SEMICONDUCTOR DEVICE, SEMICONDUCTOR MODULE, AND MANUFACTURING METHOD

(71) Applicant: FUJI ELECTRIC CO., LTD., Kanagawa (JP)

(72) Inventor: Koh Yoshikawa, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 349 days.

(21) Appl. No.: 18/673,261

(22) Filed: May 23, 2024

(65) Prior Publication Data

US 2025/0040161 A1 Jan. 30, 2025

(30) Foreign Application Priority Data

Jul. 24, 2023 (JP) ................................ 2023-119840

(51) Int. Cl.

*H10D 12/00* (2025.01)
*H10D 62/10* (2025.01)
*H10D 62/13* (2025.01)
*H10D 64/00* (2025.01)

(52) U.S. Cl.

CPC ......... *H10D 12/481* (2025.01); *H10D 62/127* (2025.01); *H10D 62/133* (2025.01); *H10D 64/117* (2025.01)

(58) Field of Classification Search

CPC .................................................. H01D 12/481
USPC ........................................................ 257/139
See application file for complete search history.

(56) References Cited

U.S. PATENT DOCUMENTS

2008/0079066 A1 4/2008 Hamaguchi
2013/0015493 A1* 1/2013 Senoo .................. H10D 12/032 257/E29.198
2015/0108564 A1 4/2015 Miura
2021/0384343 A1* 12/2021 Takeuchi ............. H10D 12/031
2023/0282737 A1 9/2023 Yoshikawa

FOREIGN PATENT DOCUMENTS

JP H09283755 A 10/1997
JP H10173170 A 6/1998
JP 2008091491 A 4/2008
JP 2023128635 A 9/2023
WO 2013172079 A1 11/2013

* cited by examiner

*Primary Examiner* — Ajay Arora

(57) ABSTRACT

Provided is a semiconductor device including a portion which operates as a transistor, in which the transistor includes a gate trench portion to which a gate voltage is applied, an emitter region in contact with the gate trench portion, and a base region in contact with the gate trench portion, and a threshold voltage at which the transistor transits from an off state to an on state in an ambient temperature of 25° C. is larger than a half of a first voltage for turning on the transistor.

20 Claims, 16 Drawing Sheets a–a

SEMICONDUCTOR DEVICE, SEMICONDUCTOR MODULE, AND MANUFACTURING METHOD

The contents of the following patent applications are incorporated herein by reference: NO. 2023-119840 filed in JP on Jul. 24, 2023

BACKGROUND

1. Technical Field

The present invention relates to a semiconductor device, a semiconductor module, and a manufacturing method.

2. Related Art

In the prior art, there is known a technique for, in a semiconductor device such as an Insulated Gate Bipolar Transistor (IGBT), changing, for example, arrangement of emitter regions and adjusting characteristics (see Patent Documents 1 to 3, for example).

Patent Document 1: Japanese Patent Application Publication No. 2008-91491

Patent Document 2: Japanese Patent Application Publication No. H10-173170

Patent Document 3: Japanese Patent Application Publication No. H9-283755

DESCRIPTION OF EXEMPLARY EMBODIMENTS

Figure 1:
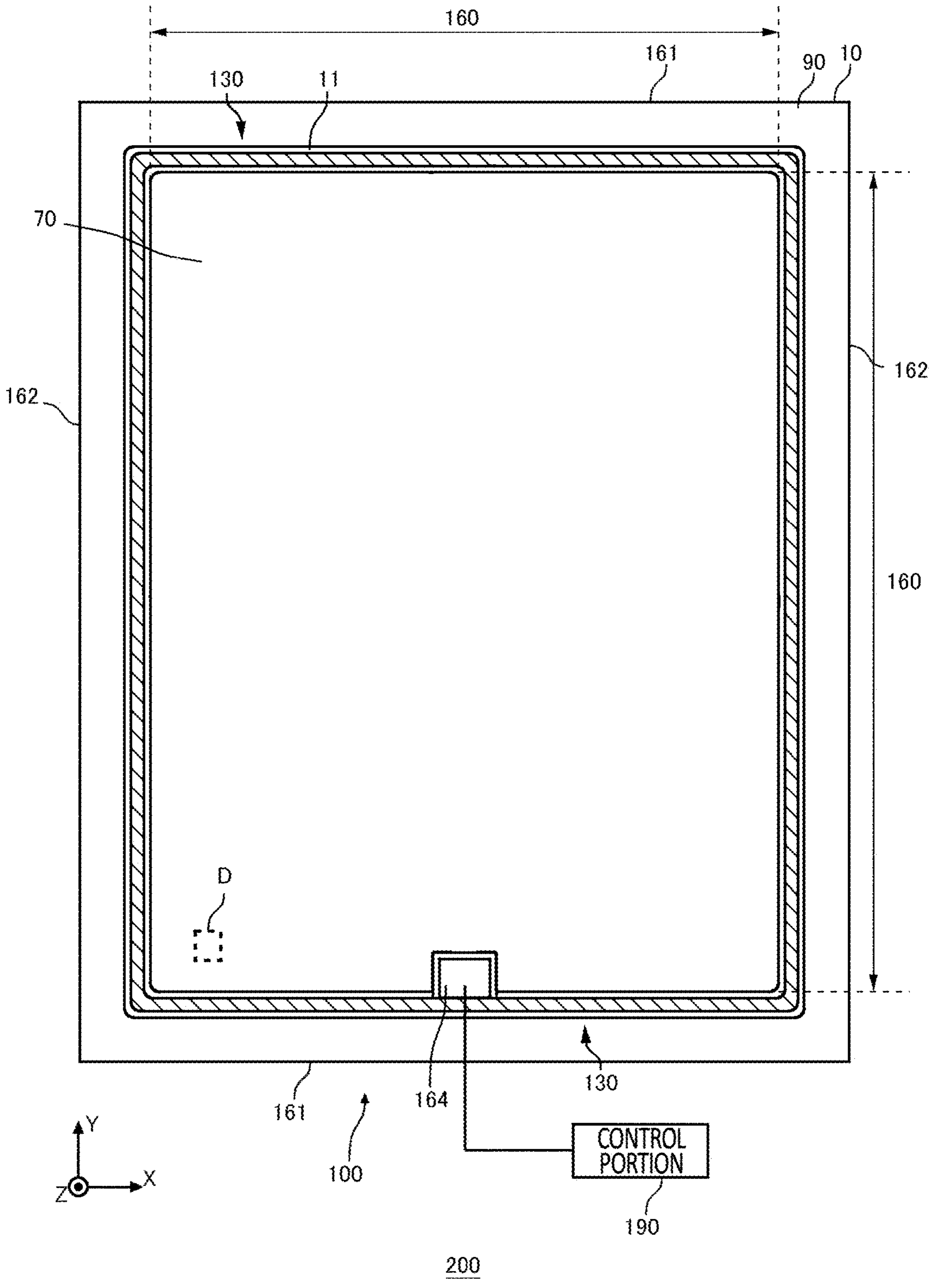
FIG. 1 is a diagram showing an example of a semiconductor device 100.

Hereinafter, embodiments of the present invention will be described. However, the following embodiments are not for limiting the invention according to the claims. In addition, not all of the combinations of features described in the embodiments are essential to the solving means of the invention.

In the present specification, one side in a direction parallel to a depth direction of a semiconductor substrate is referred to as "upper" and another side is referred to as "lower". One surface of two principal surfaces of a substrate, a layer, or other member is referred to as an upper surface, and another surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. It should be noted that a +Z axis direction and a −Z axis direction are directions opposite to each other. When the Z axis direction is described without describing a positive or negative sign, it means that the direction is parallel to the +Z axis and the −Z axis.

In the present specification, orthogonal axes parallel to the upper surface and the lower surface of the semiconductor substrate are referred to as the X axis and the Y axis. In addition, an axis perpendicular to the upper surface and the lower surface of the semiconductor substrate is referred to as the Z axis. In the present specification, the direction of the Z axis may be referred to as the depth direction. In addition, in the present specification, a direction parallel to the upper surface and the lower surface of the semiconductor substrate may be referred to as a horizontal direction, including an X axis direction and a Y axis direction.

A region from a center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side.

In the present specification, a case where a term such as "same" or "equal" is mentioned may include a case where an error due to a variation in manufacturing or the like is included. The error is, for example, within 10%.

In the present specification, a conductivity type of a doping region where doping has been carried out with an impurity is described as a P type or an N type. In the present specification, the impurity may particularly mean either a donor of an N type or an acceptor of the P type, and may be described as a dopant. In the present specification, doping means introducing the donor or the acceptor into the semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to an acceptor concentration set as a negative ion concentration, taking into account of polarities of charges. As an example, when the donor concentration is No and the acceptor concentration is NA, the net doping concentration at any position is given as ND-NA. In the present specification, the net doping concentration may be simply referred to as the doping concentration.

The donor has a function of supplying electrons to a semiconductor. The acceptor has a function of receiving electrons from the semiconductor. The donor and the acceptor are not limited to impurities themselves. For example, a VOH defect in which a vacancy (V), oxygen (O), and hydrogen (H) present in the semiconductor are attached together functions as the donor which supplies electrons. In the present specification, the VOH defect may be referred to as a hydrogen donor.

In the present specification, a description of a P+ type or an N+ type means a higher doping concentration than that of the P type or the N type, and a description of a P-type or an N-type means a lower doping concentration than that of the P type or the N type. In the present specification, a unit system is the SI base unit system unless otherwise noted. Although a unit of length is represented using cm, it may be converted to meters (m) before calculations.

A chemical concentration in the present specification refers to an atomic density of an impurity measured regardless of an electrical activation state. The chemical concentration (atomic density) can be measured by secondary ion mass spectrometry (SIMS), for example. The net doping concentration described above can be measured by capacitance-voltage profiling (CV profiling). In addition, a carrier concentration measured by spreading resistance profiling (SRP method) may be set as the net doping concentration. The carrier concentration measured by the CV profiling or the SRP method may be a value in a thermal equilibrium state. In addition, in a region of the N type, the donor concentration is sufficiently higher than the acceptor concentration, and thus the carrier concentration in the region may be defined as the donor concentration. Similarly, in a region of the P type, the carrier concentration in the region may be defined as the acceptor concentration. In the present specification, the doping concentration in the N type region may be referred to as the donor concentration, and the doping concentration in the P type region may be referred to as the acceptor concentration.

When a concentration distribution of the donor, acceptor, or net doping has a peak in a region, a value of the peak may be set as the concentration of the donor, acceptor, or net doping in the region. In a case where the concentration of the donor, acceptor, or net doping is substantially uniform in a region, or the like, an average value of the concentration of the donor, acceptor, or net doping in the region may be defined as the concentration of the donor, acceptor, or net doping. In the present specification, atoms/$cm^3$ or/$cm^3$ is used to indicate a concentration per unit volume. This unit is used for a concentration of a donor or an acceptor in a semiconductor substrate, or a chemical concentration. A notation of atoms may be omitted.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in the carrier mobility occurs when carriers are scattered due to disorder (disorder) of a crystal structure due to a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorus or arsenic serving as a donor, or an acceptor concentration of boron (boron) serving as an acceptor is about 99% of chemical concentrations of these. On the other hand, in the silicon semiconductor, a donor concentration of hydrogen serving as a donor is about 0.1% to 10% of a chemical concentration of hydrogen. Each concentration in the present specification may be a value at room temperature. As an example, a value at 300K (Kelvin) (about 26.9° C.) may be used for a value at room temperature.

FIG. 1 is a diagram showing an example of a semiconductor module 200. The semiconductor module 200 includes a semiconductor device 100 and a control portion 190. The semiconductor device 100 is, for example, a semiconductor chip formed in a semiconductor substrate 10. The control portion 190 is a circuit which controls switching of the semiconductor device 100 by applying a gate voltage to the semiconductor device 100. The control portion 190 generates a predetermined first voltage or second voltage as a gate voltage. The first voltage is a voltage generated as the gate voltage when turning the semiconductor device 100 to an on state. The second voltage is a voltage generated as the gate voltage when turning the semiconductor device 100 to an off state. The semiconductor module 200 may include a housing which houses the semiconductor device 100 and the control portion 190. The housing may be formed of a resin. In another example, the control portion 190 may be arranged outside the housing.

FIG. 1 is a diagram showing an example of the semiconductor device 100. FIG. 1 shows a position at which each member is projected on an upper surface of the semiconductor substrate 10. FIG. 1 shows only some members of the semiconductor device 100, and illustration of some members is omitted.

The semiconductor device 100 includes the semiconductor substrate 10. The semiconductor substrate 10 is a substrate formed of a semiconductor material. Although the semiconductor substrate 10 is a silicon substrate as an example, the material of the semiconductor substrate 10 is not limited to silicon.

The semiconductor substrate 10 has a first end side 161 and a second end side 162 in a top view. When simply referred to as the top view in the present specification, it means that the semiconductor substrate 10 is viewed from an upper surface side. The semiconductor substrate 10 of the present example has two sets of first end sides 161 facing each other in a top view. In addition, the semiconductor substrate 10 of the present example has two sets of second end sides 162 facing each other in a top view. In FIG. 1, the first end side 161 is parallel to the X axis direction. The second end side 162 is parallel to the Y axis direction. In addition, the Z axis is perpendicular to the upper surface of the semiconductor substrate 10. In addition, the first end sides 161 are perpendicular to an extending direction or a longitudinal direction of a gate trench portion which will be described below. The second end sides 162 are parallel to the extending direction or the longitudinal direction of the gate trench portion which will be described below.

The semiconductor substrate 10 is provided with an active portion 160. The active portion 160 is a region in which a main current flows in the depth direction between the upper surface and a lower surface of the semiconductor substrate 10 when the semiconductor device 100 operates. An emitter electrode is provided above the active portion 160, but illustration thereof is omitted in FIG. 1.

In the present example, the active portion 160 is provided with a transistor portion 70 which operates as a transistor such as an IGBT. In another example, the transistor portion 70 and the diode portion including the diode device such as a Free Wheel Diode (FWD) may be alternately disposed along a predetermined array direction on the upper surface of the semiconductor substrate 10. Although one transistor portion 70 is provided in the present example, a plurality of transistor portions 70 may also be provided. A P+ type well region or a gate runner may be provided between the transistor portions 70.

The transistor portion 70 has the collector region of the P+ type in a region in contact with the lower surface of the semiconductor substrate 10. Further, in the transistor portion 70, a surface MOS structure including an N+ type emitter region, a P-type base region, an N-type drift region, a gate conductive portion, and a gate dielectric film is arranged periodically on the upper surface side of the semiconductor substrate 10.

The semiconductor device 100 may have one or more pads above the semiconductor substrate 10. The semiconductor device 100 in the present example includes a gate pad 164. The semiconductor device 100 may have a pad such as an anode pad, a cathode pad, or a current detection pad. Each pad is disposed in the vicinity of the first end side 161. The vicinity of the first end side 161 refers to a region between the first end side 161 and the emitter electrode in a top view. When the semiconductor device 100 is mounted, each pad may be connected to an external circuit via a wiring such as a wire.

A gate potential is applied to the gate pad 164. The gate pad 164 is electrically connected to a conductive portion of the gate trench portion of the active portion 160. The semiconductor device 100 includes a gate runner 130 that connects the gate pad 164 and the gate trench portion. In FIG. 1, the gate runner 130 is hatched with diagonal lines.

The gate runner 130 is disposed between the active portion 160 and the first end side 161 or the second end side 162 in a top view. The gate runner 130 in the present example encloses the active portion 160 in a top view. A region surrounded by the gate runner 130 in a top view may be the active portion 160. Further, the gate runner 130 is connected to the gate pad 164. The gate runner 130 is disposed above the semiconductor substrate 10. The gate runner 130 may be a metal wiring containing aluminum or the like. The gate runner 130 may be provided separate from the emitter electrode.

A P type outer circumferential well region 11 is provided so as to overlap the gate runner 130. That is, similar to the gate runner 130, the P type outer circumferential well region 11 surrounds the active portion 160 in a top view. The P type outer circumferential well region 11 is provided so as to extend with a predetermined width also in a range not overlapping the gate runner 130. The P type outer circumferential well region 11 is a region of the second conductivity type. The P type outer circumferential well region 11 of the present example is of the P+ type. A doping concentration of the P type outer circumferential well region 11 may be $5.0\times10^{17}$ atoms/cm$^3$ or more and $5.0\times10^{19}$ atoms/cm$^3$ or less. A doping concentration of the P type outer circumferential well region 11 may be $2.0\times10^{18}$ atoms/cm$^3$ or more and $2.0\times10^{19}$ atoms/cm$^3$ or less.

The semiconductor device 100 may include a temperature sensing portion (not shown) which is a PN junction diode formed of polysilicon or the like, and a current detection portion (not shown) which simulates an operation of a transistor portion 70 provided in the active portion 160. The temperature sensing portion may be connected to the anode pad and the cathode pad via wiring. When the temperature sensing portion is provided, the temperature sensing portion is preferably provided at the center of the semiconductor substrate 10 in the X axis direction and the Y axis direction.

The semiconductor device 100 of the present example includes an edge termination structure portion 90 between the active portion 160 and the first end side 161 or the second end side 162 in a top view. The edge termination structure portion 90 of the present example is disposed between the outer circumferential gate runner 130 and the first end side 161 or the second end side 162. The edge termination structure portion 90 reduces electric field strength on the upper surface side of the semiconductor substrate 10. The edge termination structure portion 90 may include at least one of a guard ring, a field plate, or a RESURF which is annularly provided enclosing the active portion 160.

Figure 2:
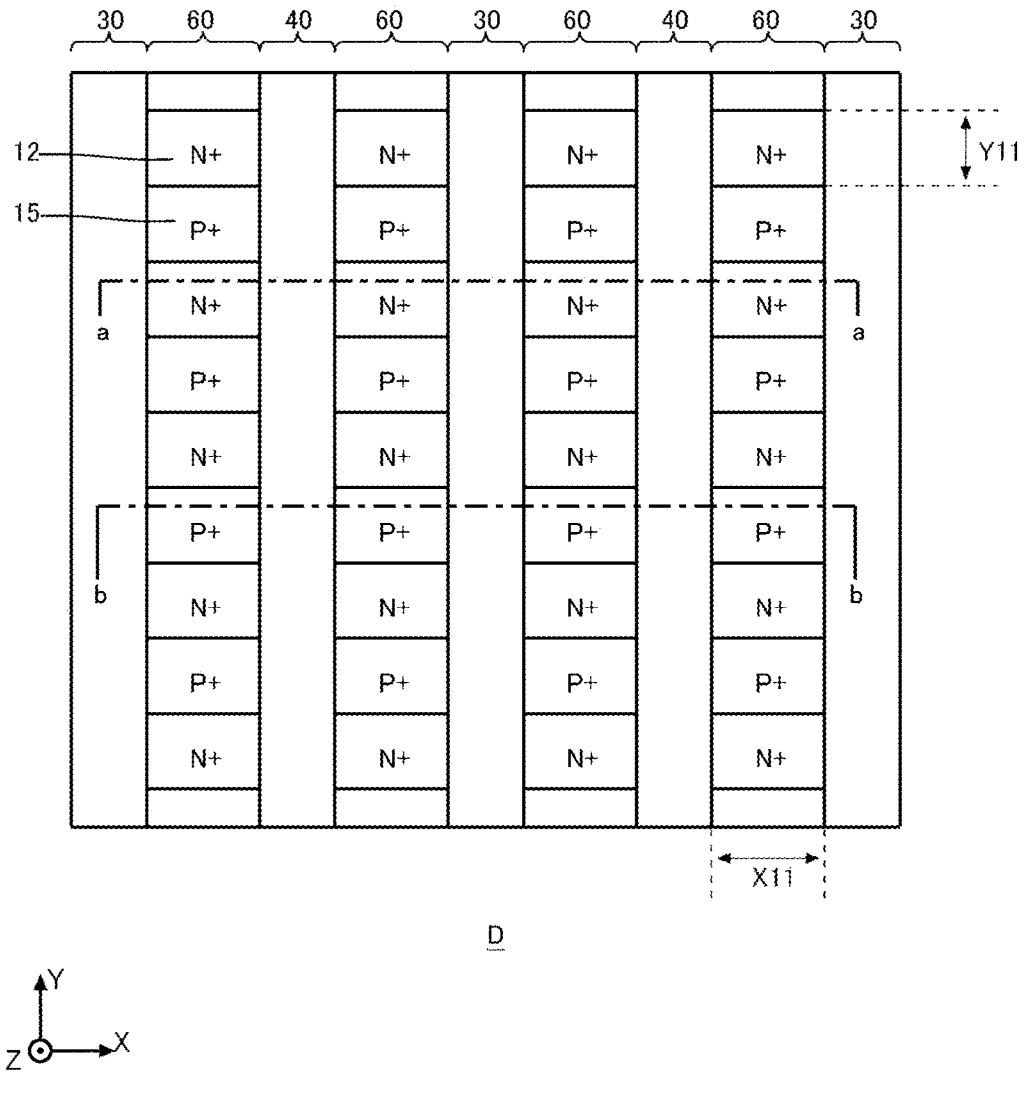
FIG. 2 is an example of an enlarged view of a region D in FIG. 1.

FIG. 2 is an example of an enlarged view of a region D in FIG. 1. FIG. 2 shows a comparative example of the structure of the region D. The region D is a region which includes the transistor portion 70 of the active portion 160 shown in FIG. 1. FIG. 2 shows a structure of the upper surface of the semiconductor substrate 10 in the region D. In the region D, the semiconductor device 100 includes one or more gate trench portions 40, one or more emitter regions 12, and one or more contact regions 15. The semiconductor device 100 may further include one or more dummy trench portions 30. In the present specification, the gate trench portion 40 and the dummy trench portion 30 may be each referred to as a trench portion. When a term "trench portion" is simply mentioned in the present specification, the trench portion may be either the gate trench portion 40 or the dummy trench portion 30.

The gate trench portion 40 has a longitudinal length in a first direction at the upper surface of the semiconductor substrate 10. In the present example, the gate trench portion 40 is provided to extend in the Y axis direction which is the first direction. The gate trench portion 40 is provided from the upper surface of the semiconductor substrate 10 to the inside of the semiconductor substrate 10. A gate conductive portion formed of a conductive material such as polysilicon is arranged inside the gate trench portion 40. The gate conductive portion is electrically connected to the gate runner 130 (see FIG. 1), and a predetermined gate voltage is applied thereto.

A plurality of trench portions are arrayed at predetermined intervals in a second direction intersecting with the first direction. The second direction in the present example is the X axis direction orthogonal to the first direction (the Y axis direction). As shown in FIG. 2, a trench portion adjacent to a gate trench portion 40 in the Y axis direction may be a dummy trench portion 30. Note that, however, gate trench portions 40 may be arranged to be adjacent to each other in the Y axis direction. As shown in FIG. 2, a trench portion adjacent to a dummy trench portion 30 in the Y axis direction may be a gate trench portion 40, or may be a dummy trench portion 30. In the Y axis direction, one or more dummy trench portions 30 may be arranged between two gate trench portions 40.

A region that is sandwiched between two trench portions in the X axis direction and that is of the semiconductor substrate 10 is defined as a mesa portion 60. Each end of the mesa portion 60 in the X axis direction is a boundary portion with each trench portion. A depth position of a lower end of the mesa portion 60 is to be the same as a depth position of a lower end of at least one of the trench portions on both sides.

An emitter region 12 is a region of the N+ type which is provided to be exposed on the upper surface in the semiconductor substrate 10. The emitter region 12 is in contact with the gate trench portion 40. The emitter region 12 may be provided in each mesa portion 60 that is in contact with the gate trench portion 40. A length of one emitter region 12 in the Y axis direction is defined as Y11, and a length thereof in the X axis direction is defined as X11. The length X11 is the same as a width of the mesa portion 60 in the X axis direction. The length X11 is larger than the length Y11. The emitter region 12 of the present example has a longitudinal length in the X axis direction. Each of the emitter regions 12 may have a band shape extending in the X axis direction. In the present example, the longitudinal direction of the emitter region 12 and the longitudinal direction of the trench portion are orthogonal. In the present specification, a structure in which the length of the emitter region 12 in the X axis direction and the width of the mesa portion 60 in the X axis direction are the same may be referred to as an emitter orthogonal type.

The contact region 15 is a region of the P type which is exposed on the upper surface of the semiconductor substrate 10 in the mesa portion 60 and is connected to an emitter electrode. The contact region 15 may be a partial region of a base region which will be described below, or may be a region of the P+ type having a higher doping concentration than the base region. When the contact region 15 has a higher doping concentration than the base region, a contact resistance between the contact region 15 and the emitter electrode can be reduced.

The contact region 15 is arranged alternately with the emitter region 12 along the Y axis direction. The contact region 15 and the emitter region 12 may be arranged alternately in the Y axis direction at least at a position in contact with the gate trench portion 40. The contact region 15 also has a longitudinal length in the X axis direction. The width of the contact region 15 in the X axis direction is equal to the width of the mesa portion 60 in the X axis direction.

Figure 3:
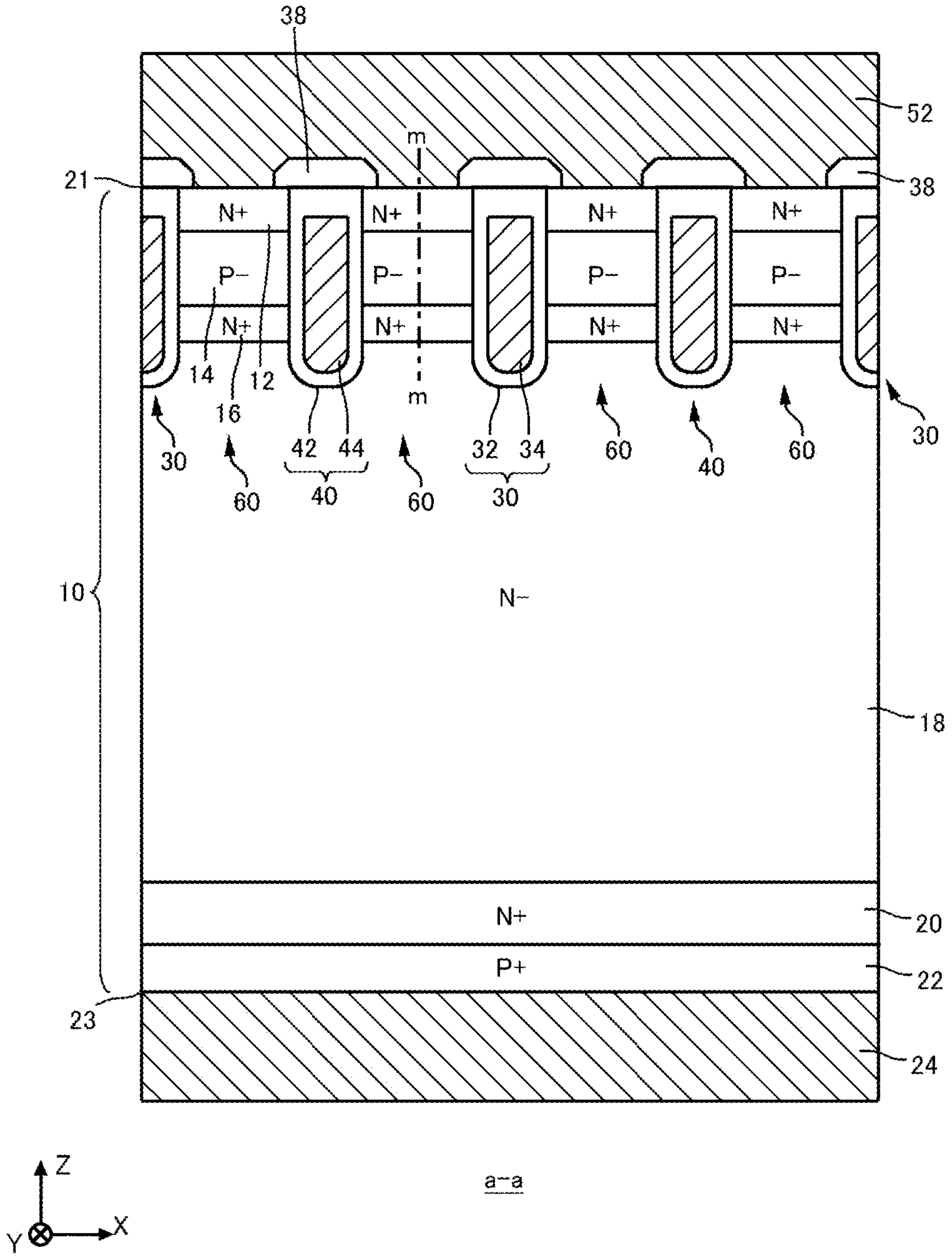
FIG. 3 is a diagram showing an example of a cross section a-a in FIG. 2.

FIG. 3 is a diagram showing an example of a cross section a-a in FIG. 2. The cross section a-a is an XZ cross section that passes through the emitter regions 12. The semiconductor device 100 of the present example has, in the cross section, the semiconductor substrate 10, an interlayer dielectric film 38, the emitter electrode 52, and a collector electrode 24.

The emitter electrode 52 is provided above the upper surface 21 of the semiconductor substrate 10. A part of the upper surface 21 of the semiconductor substrate 10 is covered by the interlayer dielectric film 38. The emitter electrode 52 is in contact with at least a part of the upper surface 21 of the semiconductor substrate 10 not covered by the interlayer dielectric film 38. The emitter electrode 52 of the present example is in contact with the emitter regions 12. As will be described below, the emitter electrode 52 is also in contact with the contact regions 15.

The emitter electrode 52 is formed of a material including metal. For example, at least a part of the region of the emitter electrode 52 is formed of aluminum or an aluminum-silicon alloy, for example, a metal alloy such as AlSi and AlSiCu. The emitter electrode 52 may have a barrier metal formed of titanium, titanium nitride, or the like below a region formed of aluminum or the like. The barrier metal may be in contact with the semiconductor substrate 10. The emitter electrode 52 may have a metal plug formed tungsten or the like below the region formed of aluminum or the like. The metal plug may have a portion which is formed below the upper surface 21 of the semiconductor substrate 10.

The collector electrode 24 is provided on the lower surface 23 of the semiconductor substrate 10. Similar to the emitter electrode 52, the collector electrode 24 is formed of a metal material such as aluminum. In the present specification, a direction in which the emitter electrode 52 and the collector electrode 24 are connected to each other (Z axis direction) is referred to as the depth direction.

The interlayer dielectric film 38 is provided on the upper surface 21 of the semiconductor substrate 10. The interlayer dielectric film 38 is a film including at least one of a dielectric film such as silicate glass to which an impurity such as boron or phosphorus is added, a thermal oxide film, or other dielectric films. The interlayer dielectric film 38 may cover each trench portion.

A base region 14 of the P-type is provided in each mesa portion 60. The base region 14 is in contact with the gate trench portion 40. The base region 14 may be in contact with each of trench portions on both sides of the mesa portion 60. At least part of the base region 14 is provided below the emitter region 12. The base region 14 may be in contact with the emitter region 12. When a predetermined first voltage is applied to the gate trench portion 40, a surface layer of the base region 14 in contact with the gate trench portion 40 is inverted to the N type region to thus form a channel. The emitter region 12 is electrically connected by the channel to a drift region 18 which will be described below.

As will be described below, the base region 14 is also provided below the contact region 15. The base region 14 is in contact with the contact region 15. As described above, a part of the base region 14 may function as the contact region 15. The base region 14 in the present example is a region of the P-type having a lower doping concentration than the contact region 15. The doping concentration of the base region 14 may be $3.0\times10^{17}$ atoms/$cm^3$ or less.

The semiconductor substrate 10 includes an N-type drift region 18. The emitter region 12 has a higher doping concentration than the drift region 18. The drift region 18 is provided below the base region 14. The drift region 18 may be in contact with the base region 14. In another example, an accumulation region 16 of the N+ type having a higher doping concentration than the drift region 18 may be provided between the drift region 18 and the base region 14. Providing the accumulation region 16 can produce an electron injection enhancement effect to decrease an ON voltage of the semiconductor device 100.

A collector region 22 of the P+ type is provided between the drift region 18 and the lower surface 23 of the semiconductor substrate 10. A doping concentration of the collector region 22 is higher than a doping concentration of the base region 14. The collector region 22 may include an acceptor which is the same as or different from an acceptor of the base region 14. The acceptor of the collector region 22 is, for example, boron. An element to be the acceptor is not limited to the examples described above. The collector region 22 is exposed on the lower surface 23 of the semiconductor substrate 10, and is connected to the collector electrode 24. The collector electrode 24 may be in contact with the entire lower surface 23 of the semiconductor substrate 10.

A buffer region 20 of the N+ type may be provided between the drift region 18 and the collector region 22. A doping concentration in the buffer region 20 is higher than a doping concentration in the drift region 18. The buffer region 20 may have one or more concentration peaks with a doping concentration higher than that of the drift region 18.

The doping concentration of the concentration peak refers to a doping concentration at a local maximum of the concentration peak. Further, as the doping concentration of the drift region 18, an average value of doping concentrations in the region where the doping concentration distribution is substantially flat may be used.

The buffer region 20 may be formed by ion implantation of an N type dopant such as hydrogen (proton) or phosphorus. The buffer region 20 of the present example is formed by ion implantation of hydrogen. The buffer region 20 may function as a field stopper layer which prevents a depletion layer expanding from a lower end of the base region 14 from reaching the collector region 22.

One or more gate trench portions 40 are provided on the upper surface 21 side of the semiconductor substrate 10. In the present example, the plurality of gate trench portions 40 are provided on the upper surface 21 side of the semiconductor substrate 10. In the present example, each gate trench portion 40 penetrates the base region 14 from the upper surface 21 of the semiconductor substrate 10, to reach the drift region 18. The configuration of the trench portion penetrating the doping region is not limited to the one manufactured in the order of forming the doping region and then forming the trench portion. The configuration of the trench portions penetrating the doping region also includes a configuration of forming the trench portions and then forming the doping region between the trench portions.

The gate trench portion 40 has a groove-shaped gate trench, a gate dielectric film 42, and a gate conductive portion 44 which are provided at the upper surface 21 of the semiconductor substrate 10. The gate conductive portion 44 is formed of polysilicon as a conductive material. The gate dielectric film 42 is provided covering an inner wall of the gate trench. The gate dielectric film 42 may be formed by oxidizing or nitriding a semiconductor on the inner wall of the gate trench. The gate conductive portion 44 is provided farther inward inside the gate trench than the gate dielectric film 42. That is, the gate dielectric film 42 insulates the gate conductive portion 44 from the semiconductor substrate 10.

The gate conductive portion 44 in the gate trench portion 40 may be provided to be longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner 130 at a position other than the cross section shown in FIG. 3.

The dummy trench portion 30 has a structure similar to that of the gate trench portion 40. The dummy trench portion 30 in the present example has a groove-shaped dummy trench, a dummy dielectric film 32, and a dummy conductive portion 34. Structures of the dummy trench, the dummy dielectric film 32, and the dummy conductive portion 34 are similar to those of the gate trench, the gate dielectric film 42, and the gate conductive portion 44. The dummy trench portion 30 in the cross section is covered by the interlayer dielectric film 38 on the upper surface 21 of the semiconductor substrate 10. The dummy conductive portion 34 is electrically connected to the emitter electrode 52 at a position other than the cross section shown in FIG. 3.

Figure 4:
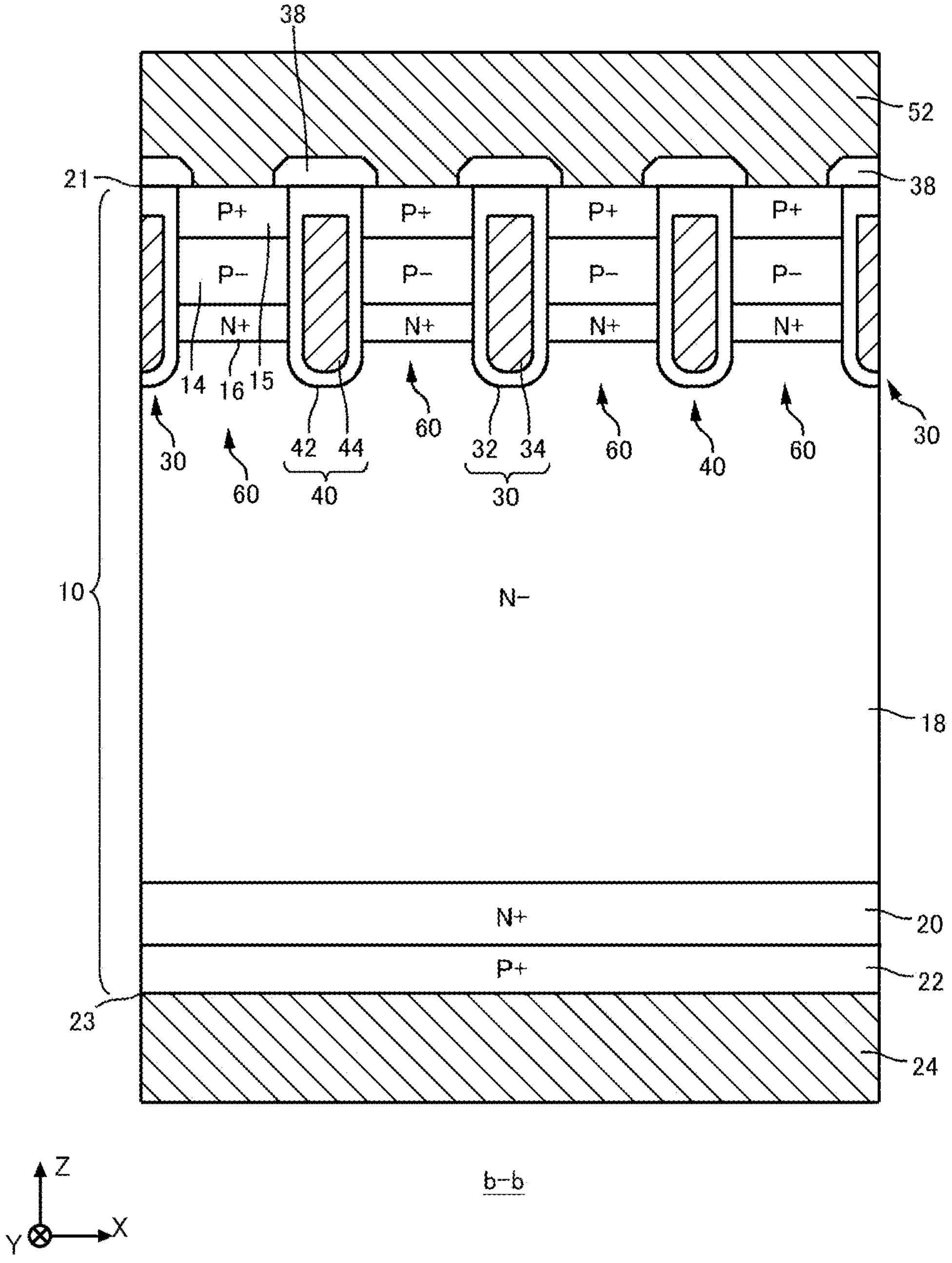
FIG. 4 is a diagram showing an example of a cross section b-b in FIG. 2.

FIG. 4 is a diagram showing an example of a cross section b-b in FIG. 2. The cross section b-b is an XZ cross section that passes through the contact regions 15. The cross section b-b has a structure similar to that of the cross section a-a except that the contact regions 15 are arranged in place of the emitter regions 12. The contact region 15 is in contact with the emitter electrode 52 on the upper surface 21 of the semiconductor substrate 10. The contact region 15 of the present example is in contact with the base region 14.

The MOS structure described with reference to FIGS. 2 to 4, which is provided on the upper surface 21 of the semiconductor substrate 10, has saturation characteristics with which the collector current is saturated even when a collector-emitter voltage is raised. As a result, the semiconductor device 100 has a short-circuit withstand capability characteristics that prevent the device from being destructed for a certain period of time in a short-circuit state where a great current and a great voltage are applied at the same time. Since the saturation current becomes extremely large when the MOS structure is formed in all of the mesa portions 60 in a state where miniaturization of the device has progressed, the saturation current may be suppressed by a thinning-out structure in which the MOS structure is not formed in some of the mesa portions 60 or the emitter orthogonal type structure in which the emitter region 12 having the longitudinal length in the X axis direction is discretely arranged in the Y axis direction. However, suppressing the saturation current with such a structure increases the ON voltage.

Current saturation characteristics of the MOS structure are expressed by the following Expression (1).

$$Isat = \frac{Z\mu nCox}{Lch}\left[\frac{1}{2}(Vge - Vth)^2\right] \quad \text{Expression (1)}$$

Isat represents the saturation current, Z represents a total emitter width of the emitter region 12 (that is, a total length in the Y axis direction), μn represents mobility of electrons, Cox represents a capacitance of the gate dielectric film 42, Lch represents a channel length in the Z axis direction, Vge represents a gate-emitter voltage, and $V_{th}$ represents a threshold voltage.

A channel resistance Rch of the MOS structure is expressed by the following Expression (2).

$$Rch \approx \frac{Lch}{Z\mu nCox(Vge - Vth)}$$

It can be seen from comparing Expressions (1) and (2) that the channel resistance Rch increases as the saturation current Isat decreases, and the channel resistance Rch decreases as the saturation current Isat increases. That is, there is a trade-off correlation in which decreasing the saturation current in order to improve short-circuit withstand capability of the semiconductor device 100 increases the ON voltage. For example, in a thinning-out emitter structure, the emitter region 12 is formed in some mesa portions 60, and thus supply of electron current to the drift region 18 becomes sparse in the X axis direction, a current flow becomes non-uniform, and the ON voltage increases. In addition, in the emitter orthogonal type structure in which the emitter region 12 having the longitudinal length in the X axis direction is discretely arranged in the Y axis direction, there is a limit on increasing the length Z (corresponding to the channel width) by which the gate trench portion 40 and the emitter region 12 are in contact with each other.

Figure 5:
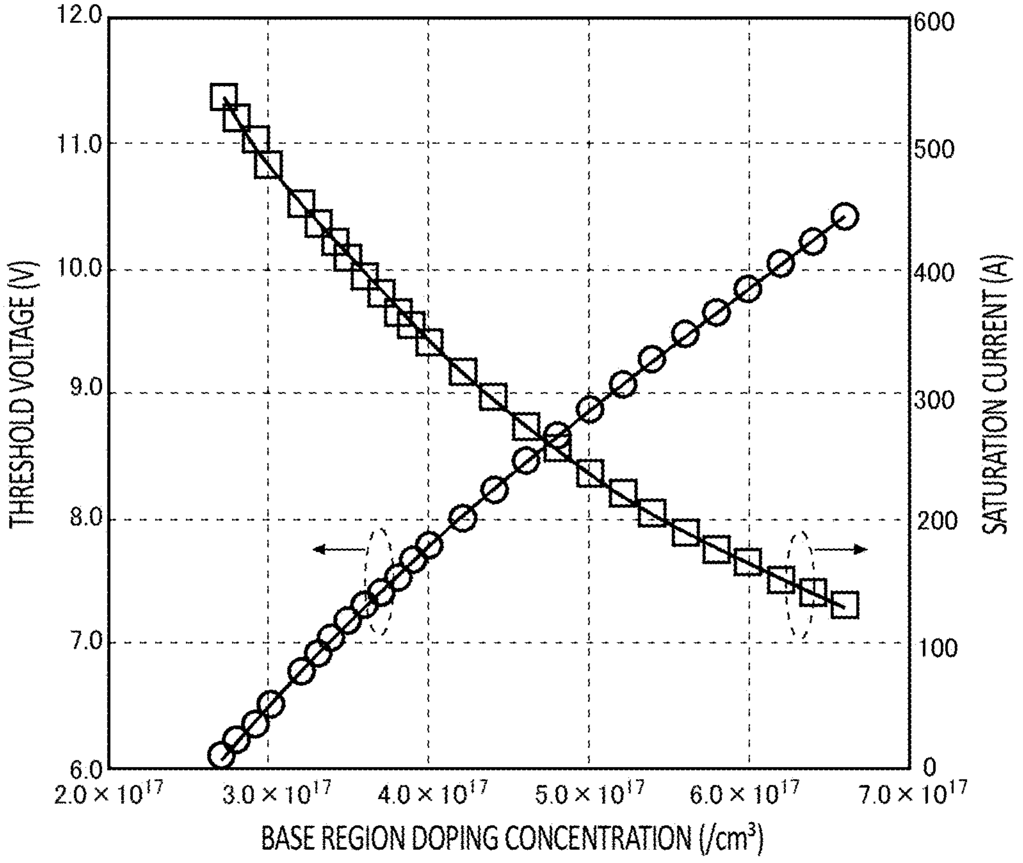
FIG. 5 is a diagram showing a relationship of a threshold voltage and a saturation current with respect to a doping concentration of a base region 14.

In descriptions hereinafter, descriptions will be given using numerical values of a semiconductor device whose withstand voltage class is a class of 1200 V and rated current is 150 A. FIG. 5 is a diagram showing a relationship of the threshold voltage and the saturation current with respect to the doping concentration of the base region 14. In the present example, characteristics of the semiconductor device 100 of the emitter orthogonal type that has been described with reference to FIGS. 2 to 4 are shown. As shown in FIG. 5, as the doping concentration of the base region 14 increases, the threshold voltage decreases and the saturation current increases.

Figure 6:
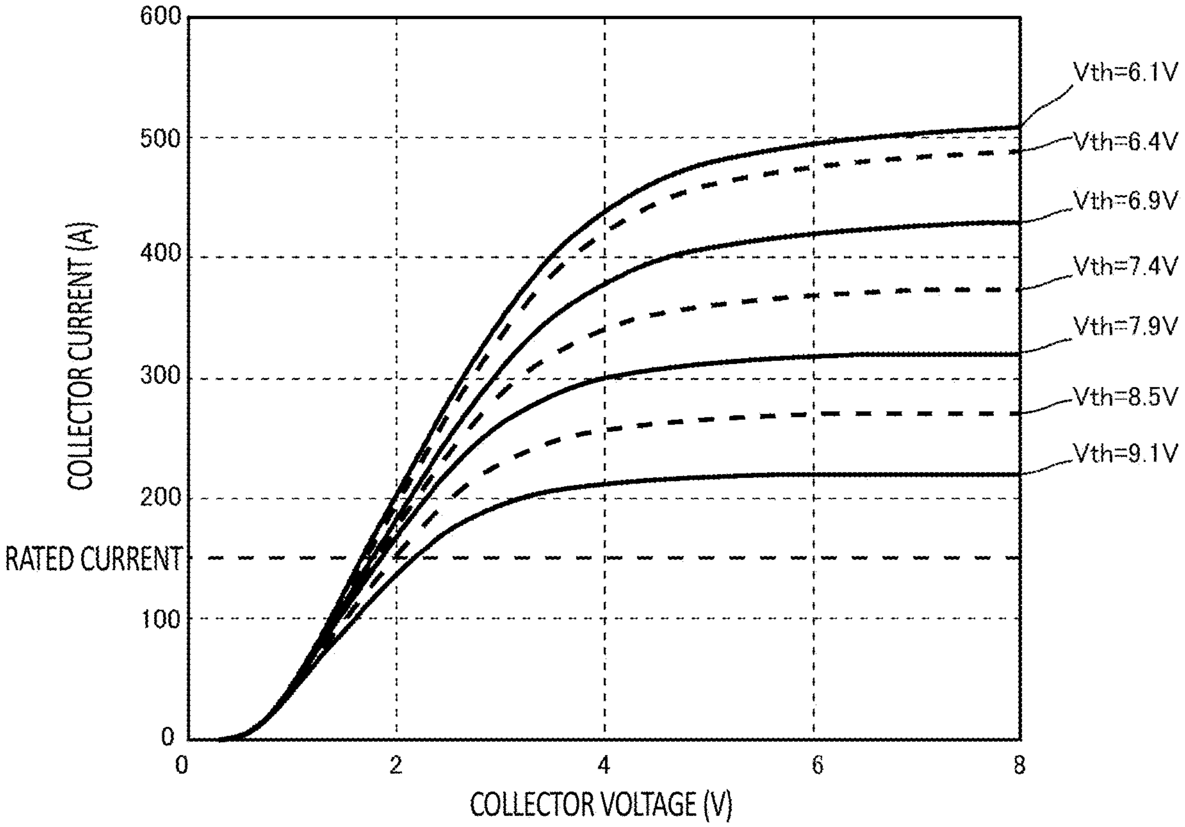
FIG. 6 is a diagram showing IV output characteristics of the semiconductor device 100 for each threshold voltage $V_{th}$.

FIG. 6 is a diagram showing IV output characteristics of the semiconductor device 100 for each threshold voltage $V_{th}$. The IV output characteristics are characteristics that indicate a relationship between a collector current and a collector voltage. The rated current of the semiconductor device 100 is set in a saturation region where the collector current varies according to the collector voltage. The threshold voltage $V_{th}$ is high regarding the ON voltage (the collector voltage) at the rated current of the semiconductor device 100. FIGS. 5 and 6 each show a trade-off correlation in which the ON voltage increases as the saturation current decreases by the adjustment of the doping concentration of the base region 14.

Figure 7:
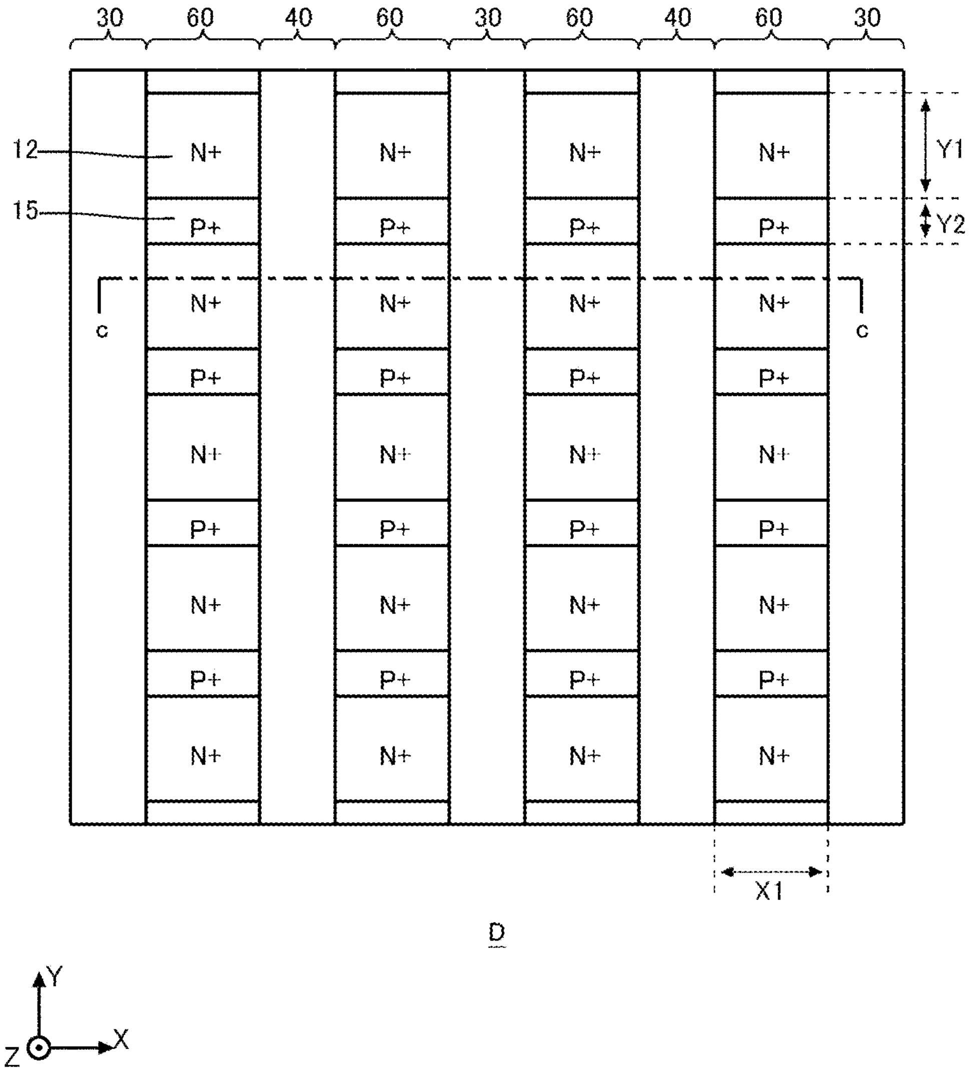
FIG. 7 is a diagram showing an example of the region D of the semiconductor device 100 according to an example.

FIG. 7 is a diagram showing an example of the region D of the semiconductor device 100 according to the example. In the semiconductor device 100 according to the example, the doping concentration of the base region 14 is adjusted so as to increase the threshold voltage $V_{th}$ and lower the saturation current. Although the ON voltage is raised by increasing the threshold voltage and lowering the saturation current, in the semiconductor device 100 according to the example, a total emitter width Z is adjusted to thus suppress the rise of the ON voltage or lower the ON voltage. Thus, both a relatively low ON voltage and a relatively low saturation current can be achieved. Alternatively, the ON voltage can be lowered while maintaining the saturation current.

In the semiconductor device 100 of the present example, the arrangement of the emitter regions 12 on the upper surface 21 is adjusted to thus adjust the total emitter width Z. For example, by setting the length Y1 of the emitter region 12 in the Y axis direction to be larger than the length X1 in the X axis direction, the total emitter width Z can be increased. By increasing the total emitter width Z, the saturation current amount increases, and the ON voltage decreases.

The length Y1 may be equal to or more than 1.5 times, equal to or more than 2 times, or equal to or more than 3 times the length X1. The length X1 of the emitter region 12 in the X axis direction may be the same as the width of the mesa portion 60 in the X axis direction. In this case, the emitter region 12 is provided continuously in the X axis direction from a position at which the emitter region 12 comes into contact with one of the two trench portions adjacent to each other in the X axis direction to a position at which it comes into contact with another of the trench portions. The length of the contact region 15 in the X axis direction may be the same as the length of the emitter region 12 in the X axis direction. In another example, the length X1 of the emitter region 12 may be smaller than the width of the mesa portion 60 in the X axis direction. In this case, the emitter region 12 is arranged in contact with the gate trench portion 40 and is not in contact with the other trench portion (for example, the dummy trench portion 30) adjacent to the gate trench portion 40.

The length Y1 of the emitter region 12 may be larger than the length Y2 of the contact region 15 in the Y axis direction. Thus, the total emitter width Z can be increased. The length Y1 may be equal to or more than 1.5 times, equal to or more than 2 times, or equal to or more than 3 times the length Y2. The lengths of the emitter region 12 and the contact region 15 in the Y axis direction are lengths at positions in contact with the gate trench portion 40.

Figure 8:
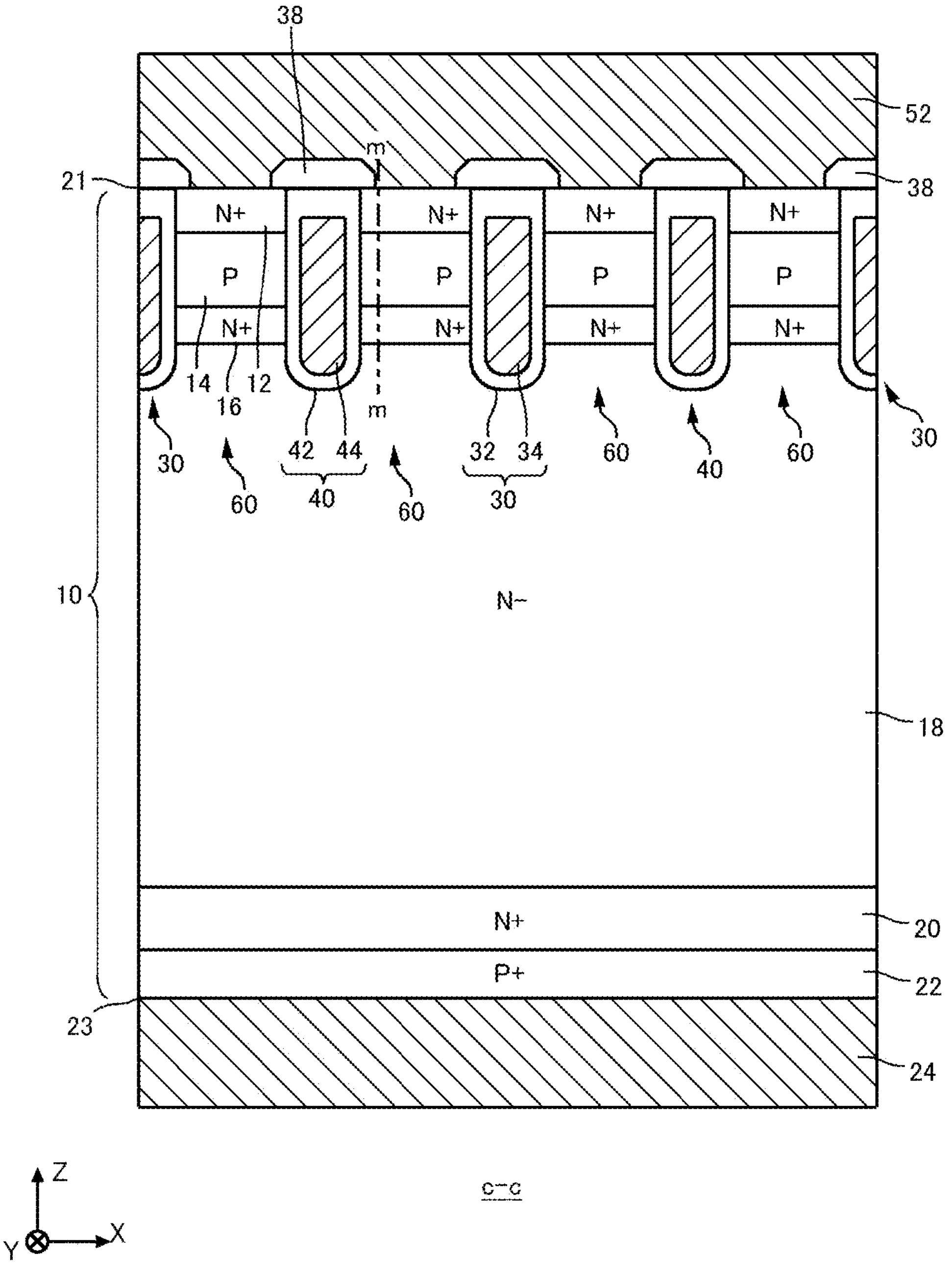
FIG. 8 is a diagram showing an example of a cross section c-c in FIG. 7.

FIG. 8 is a diagram showing an example of a cross section c-c in FIG. 7. The cross section c-c is an XZ cross section that passes through the emitter regions 12. In the semiconductor device 100 of the present example, the doping concentration of the base region 14 is different from that of the comparative example shown in FIG. 3 and the like. The semiconductor device 100 of the present example has a structure similar to that of the semiconductor device 100 described with reference to FIGS. 1 to 6 except for the doping concentration of the base region 14. The base region 14 of the present example is a P type region having a higher doping concentration than the base region 14 of the comparative example. By raising the doping concentration of the base region 14, it becomes difficult for the surface layer of the base region 14 to be inverted to the N type, and thus the threshold voltage of the semiconductor device 100 becomes high. The threshold voltage is a voltage at which the transistor transits from an off state to an on state. As an example, in a case where a waveform of a linear operation region of collector current-gate voltage characteristics ($I_{CE}$-Vge characteristics) of the transistor portion 70 is approximated by a straight line, the threshold voltage is a value of the gate voltage Vge obtained when the collector current $I_{CE}$ in the straight line becomes 0.

Applied to the gate trench portion 40 as the gate voltage Vge is the first voltage in the case of turning the transistor such as an IGBT to the on state or the second voltage in the case of turning the transistor portion 70 to the off state. As an example, the first voltage is 15 V, and the second voltage is 0 V. The second voltage may be a voltage having a different sign from the first voltage. The second voltage may be a voltage that has the same absolute value as the first voltage but with a different sign. The second voltage may be −15 V. The control portion 190 shown in FIG. 1 may generate the first voltage and the second voltage.

In the semiconductor device 100 of the present example, the threshold voltage in an ambient temperature of 25° C. is larger than a half of the first voltage. For example, when the first voltage is 15 V, the threshold voltage is larger than 7.5 V. The threshold voltage may be closer to the first voltage than an intermediate voltage between the first voltage and the second voltage. The intermediate voltage between the first voltage and the second voltage is an average voltage of the first voltage and the second voltage. For example, when the first voltage is 15 V and the second voltage is 0 V, the intermediate voltage is 7.5 V. In this case, the threshold voltage of the present example is larger than 7.5 V. In the present specification, the threshold voltage in the ambient temperature of 25° C. is simply referred to as the threshold voltage. In the semiconductor device 100 of the comparative example, the threshold voltage is about 6.0 V. By increasing the threshold voltage, the saturation current amount decreases.

In the semiconductor device 100 of the present example, as described with reference to FIG. 7, by adjusting the arrangement of the emitter regions 12, it is possible to lower the ON voltage although the saturation current amount increases. Thus, by increasing the total emitter width Z and increasing the saturation current amount within a range of the saturation current amount that has decreased due to the rise of the threshold voltage, the ON voltage can be lowered while maintaining or lowering the saturation current amount.

The threshold voltage $V_{th}$ may be 55% or more of the first voltage. The threshold voltage $V_{th}$ may be 65% or more or 75% or more of the first voltage. The saturation current amount can be made smaller as the threshold voltage $V_{th}$ increases, and thus a margin for lowing the ON voltage increases. When the first voltage is 15 V, the threshold voltage may be 8.5 V or more, 9.5 V or more, or 10 V or more. When the threshold voltage $V_{th}$ becomes too large, it becomes difficult for the semiconductor device 100 to be turned on. A ratio of the threshold voltage $V_{th}$ to the first voltage may be 80% or less or 70% or less.

A difference between the first voltage and the second voltage is defined as a reference voltage Vs. For example, when the first voltage is 15 V and the second voltage is 0 V, the reference voltage Vs is 15−0=15 V. A difference between the threshold voltage $V_{th}$ and the second voltage is defined as a relative voltage Vr. For example, when the second voltage is 0 V, the relative voltage Vr is $V_{th}$-0=$V_{th}$. A ratio of the relative voltage Vr to the reference voltage Vs may be 55% or more. A ratio of the relative voltage Vr to the reference voltage Vs may be 60% or more or 65% or more. The saturation current amount can be made smaller as the relative voltage increases, and thus a margin for lowing the ON voltage increases. When the first voltage is 15 V and the second voltage is 0 V, the threshold voltage may be 8.5 V or more, 9.5 V or more, or 10 V or more.

When the relative voltage Vr becomes too large, it becomes difficult for the semiconductor device 100 to be turned on. A ratio of the relative voltage Vr to the reference voltage Vs may be 80% or less or 70% or less.

Figure 9:
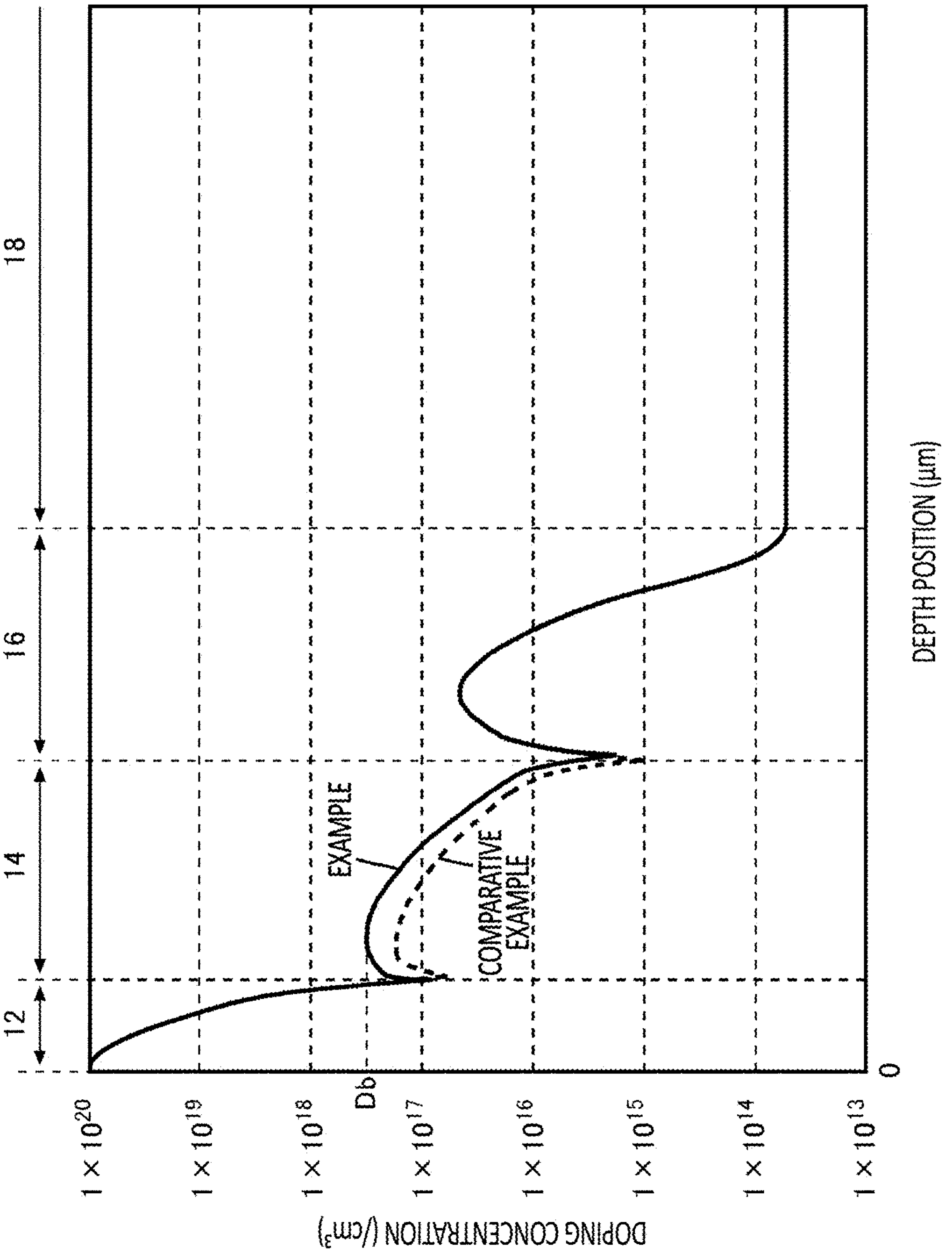
FIG. 9 is a diagram showing an example of a doping concentration distribution on a line m-m in FIG. 8.

FIG. 9 is a diagram showing an example of a doping concentration distribution on the line m-m in FIG. 8. The line m-m is a straight line that passes through the emitter region 12, the base region 14, and the accumulation region 16 in the mesa portion 60 in contact with the gate trench portion 40 and is parallel to the Z axis. The line m-m may pass through the emitter region 12, the base region 14, and the accumulation region 16 at a position in the vicinity of the gate trench portion 40 or at a position in contact with the gate trench portion 40. In FIG. 9, the doping concentration distribution of the semiconductor device 100 according to the example shown in FIG. 8 and the like is indicated by a solid line, and the doping concentration distribution of the semiconductor device 100 according to the comparative example shown in FIG. 3 and the like is indicated by a broken line.

The emitter region 12, the base region 14, and the accumulation region 16 may each have a peak of the doping concentration in the depth direction. The doping concentration distribution in regions other than the base region 14 is similar for the example and the comparative example.

A maximum value of the doping concentration in the base region 14 according to the example is defined as a doping concentration Db in the base region 14. With a high doping concentration Db, it is possible to increase the threshold voltage $V_{th}$ of the semiconductor device 100 and reduce the saturation current amount. The doping concentration Db in a case where a gate oxidized film thickness (the film thickness of the gate dielectric film 42 in the example of FIG. 8) is about 110 nm may be $4.0\times10^{17}$ atoms/$cm^3$ or more. The doping concentration Db may be $5.0\times10^{17}$ atoms/$cm^3$ or more, $6.0\times10^{17}$ atoms/$cm^3$ or more, or $7.0\times10^{17}$ atoms/$cm^3$ or more. The doping concentration Db may be $1.0\times10^{18}$ atoms/$cm^3$ or less, $8.0\times10^{17}$ atoms/$cm^3$ or less, or $7.0\times10^{17}$ atoms/$cm^3$ or less so that the threshold voltage $V_{th}$ does not become too high.

Figure 10:
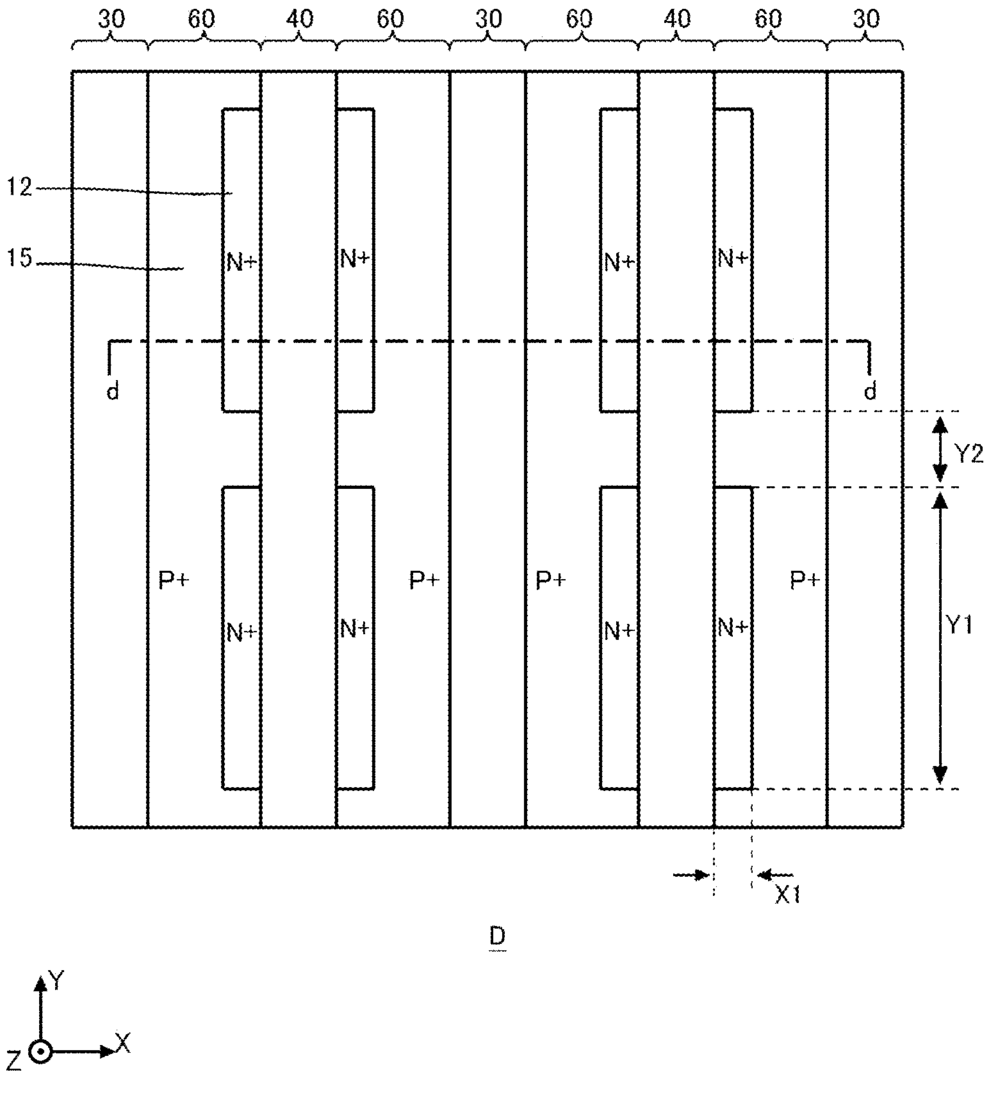
FIG. 10 is a diagram showing another example of a structure of the semiconductor device 100 in the region D according to the example.

FIG. 10 is a diagram showing another example of the structure of the semiconductor device 100 in the region D according to the example. In the semiconductor device 100 of the present example, the arrangement of the emitter regions 12 and the contact regions 15 is different from that of the example shown in FIG. 7. Other structures are similar to those of the semiconductor device 100 according to any of the aspects described with reference to FIGS. 1 to 9.

The length X1 of the emitter region 12 of the present example in the X axis direction is smaller than the width of the mesa portion 60 in the X axis direction. The emitter region 12 is in contact with the gate trench portion 40 and is not in contact with the dummy trench portion 30 adjacent to the gate trench portion 40. The contact region 15 is arranged between the emitter region 12 and the dummy trench portion 30. The contact region 15 is also arranged among the emitter regions 12 discretely arranged in the Y axis direction. According to the present example, even when the length Y1 of the emitter region 12 in the Y axis direction is increased, an exposure area of the contact region 15 on the upper surface of the mesa portion 60 can be secured. Thus, it is easy to adjust the ON voltage. In the present specification, a structure in which the length X1 of the emitter region 12 in the X axis direction is smaller than the width of the mesa portion 60 in the X axis direction may be referred to as an emitter parallel type.

The length Y1 of the emitter region 12 may be equal to or more than 2 times, equal to or more than 3 times, or equal to or more than 5 times the length X1. Setting the length Y1 to be larger than the length X1 can increase a length of a channel formed below the emitter region 12 in the Y axis direction, and can improve a channel density.

As shown in FIG. 10, in one mesa portion 60, a plurality of emitter regions 12 may be arranged to be spaced apart from each other in the Y axis direction. A distance between the two emitter regions 12 adjacent to each other in the Y axis direction (the length Y2 of the contact region 15 in FIG. 10) may be smaller than the length Y1, or may be a half or less, ¼ or less, or 1/10 or less of the length Y1. In another example, only one emitter region 12 may be continuously arranged in one mesa portion 60 in the Y axis direction. In this case, the length Y1 of the emitter region 12 may be a half or more or ¾ or more of a length of the mesa portion 60 in the Y axis direction.

Figure 11:
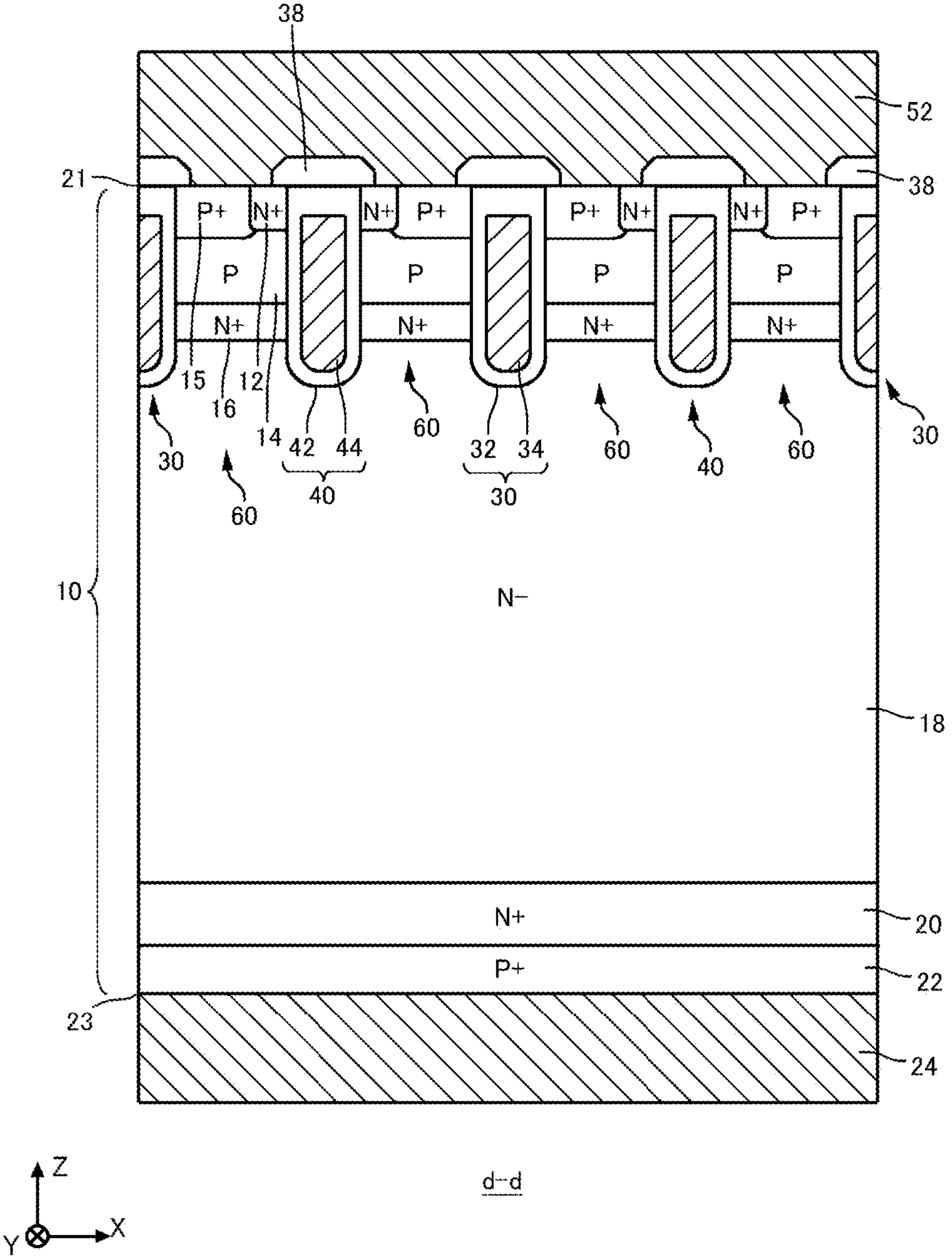
FIG. 11 is a diagram showing an example of a cross section d-d in FIG. 10.

FIG. 11 is a diagram showing an example of a cross section d-d in FIG. 10. The cross section d-d is an XZ plane that passes through the emitter regions 12 and the contact regions 15. As described above, the emitter region 12 is arranged in contact with the gate trench portion 40 and is not in contact with the dummy trench portion 30. The contact region 15 is arranged between the emitter region 12 and the dummy trench portion 30. Structures other than the emitter region 12 and the contact region 15 are similar to those of the semiconductor device 100 according to any of the aspects described with reference to FIGS. 1 to 9.

Figure 12:
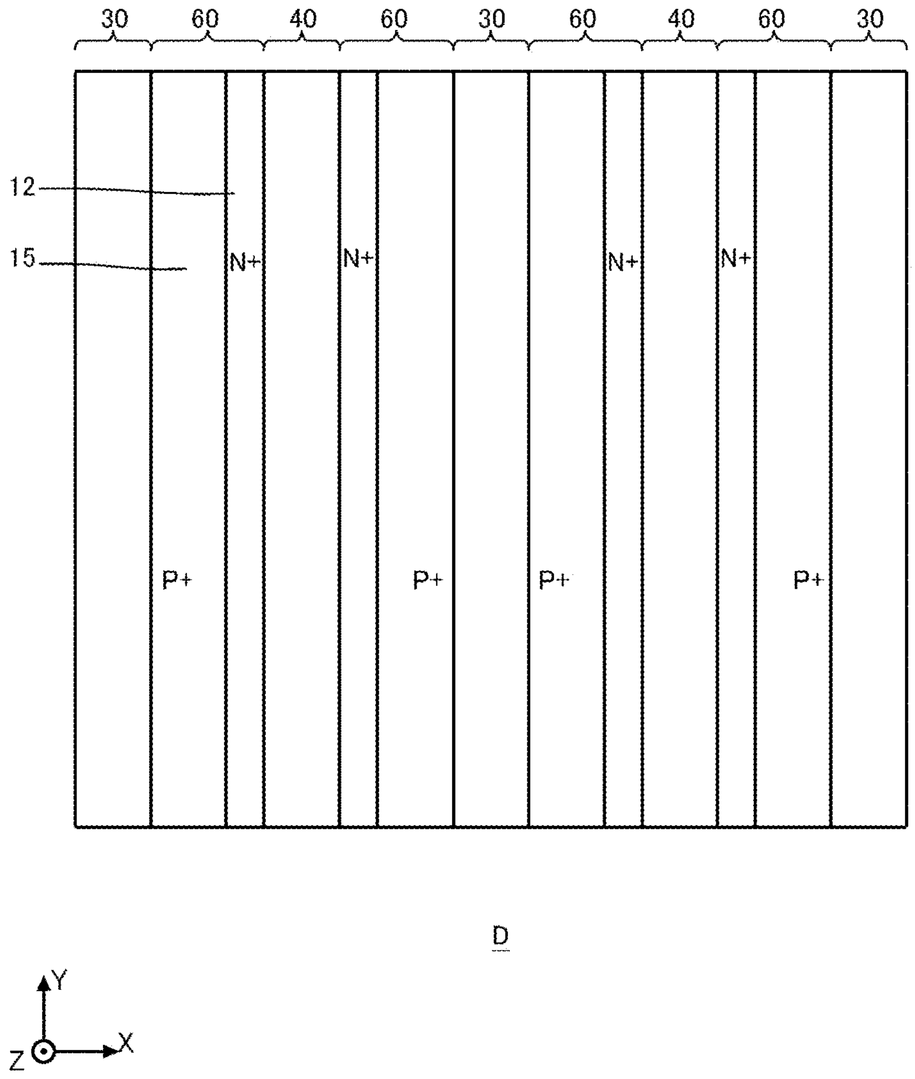
FIG. 12 is a diagram showing another example of the structure of the semiconductor device 100 in the region D according to the example.

FIG. 12 is a diagram showing another example of the structure of the semiconductor device 100 in the region D according to the example. In the semiconductor device 100 of the present example, only one emitter region 12 is continuously provided in the Y axis direction in one mesa portion 60. Other structures are similar to those of the semiconductor device 100 according to any of the aspects described with reference to FIGS. 1 to 11. According to the present example, the total emitter width Z can be further increased.

Figure 13:
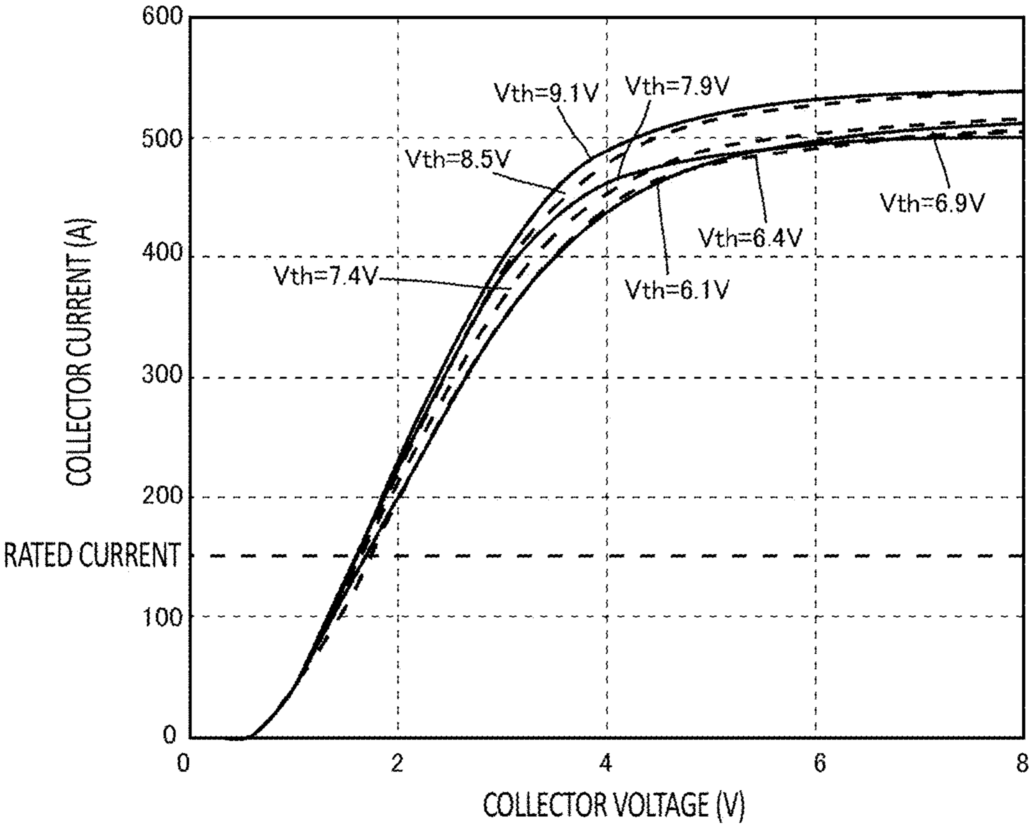
FIG. 13 is a diagram showing an example of $I_{CE}$-$V_{CE}$ characteristics of the semiconductor device 100.

FIG. 13 is a diagram showing an example of the $I_{CE}$-$V_{CE}$ characteristics of the semiconductor device 100. FIG. 13 shows characteristics of a plurality of semiconductor devices 100 having different threshold voltages $V_{th}$. In the example of FIG. 13, the threshold voltage $V_{th}$ is differentiated by differentiating the doping concentration of the base region 14. In addition, the saturation current amount of each of the semiconductor devices 100 is set to be basically constant (about 500 A) by adjusting the total channel width Z.

As shown in FIG. 13, the ON voltage (collector-emitter voltage $V_{CE}$) at the rated current, for example, decreases as the threshold voltage $V_{th}$ increases. With the semiconductor device 100 according to the example, the ON voltage can be reduced while maintaining or lowering the saturation current amount. The saturation current amount of the semiconductor device 100 may be adjusted so as to become equal to or more than 3 times and equal to or less than 7 times the rated current.

Figure 14:
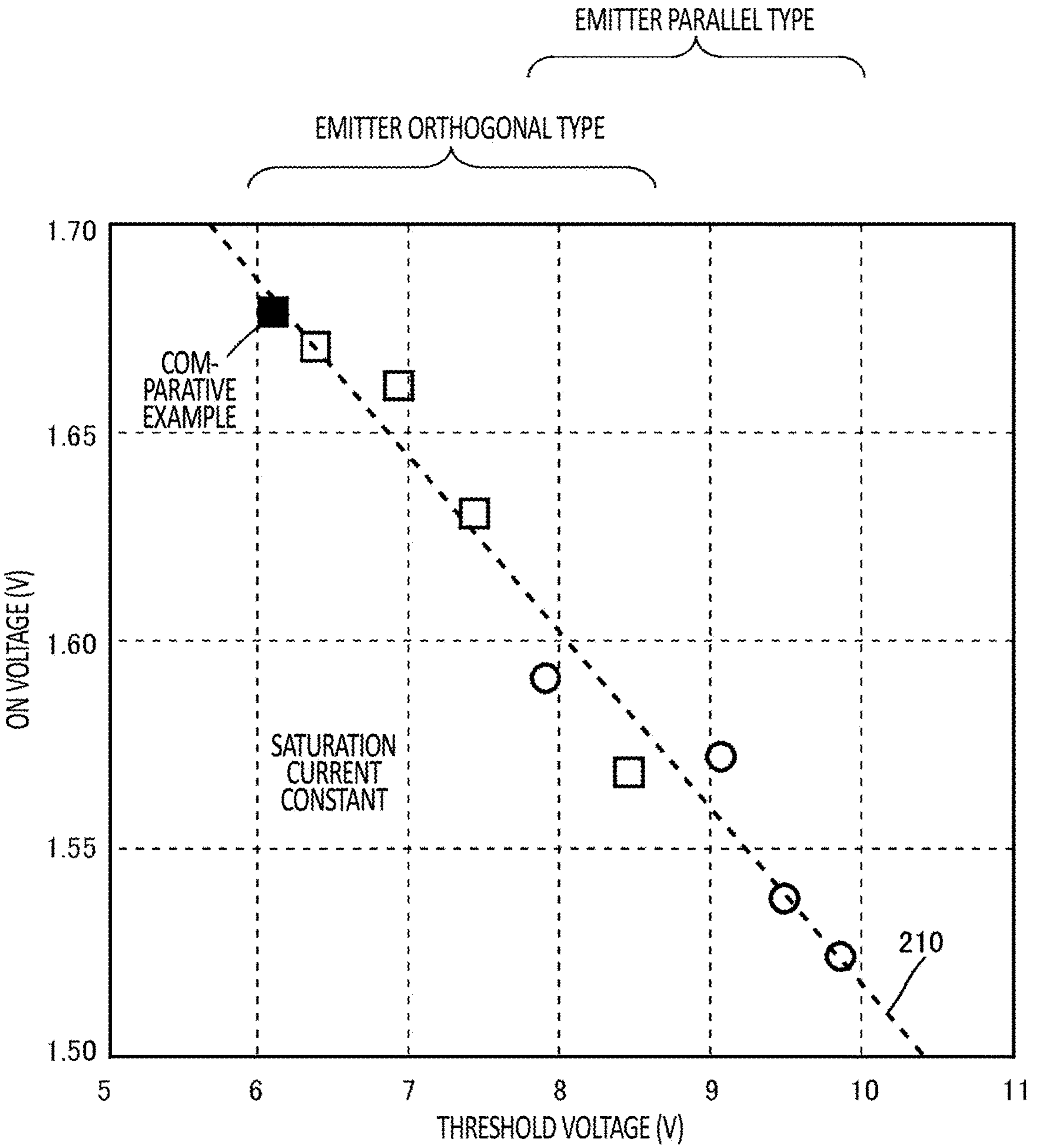
FIG. 14 is a diagram showing a relationship between a threshold voltage and ON voltage of the semiconductor device 100.

FIG. 14 is a diagram showing a relationship between the threshold voltage and ON voltage of the semiconductor device 100. The first voltage in FIGS. 13 and 14 is 15 V, and the second voltage is 0 V. FIG. 14 shows the ON voltage obtained by adjusting the total channel width Z so that the saturation current amount becomes basically constant, similar to the example of FIG. 13. The square plots in FIG. 14 correspond to the channel orthogonal type semiconductor device 100 as that shown in FIG. 2 or 7. The black square plot corresponds to the comparative example shown in FIG. 2. The round plots in FIG. 14 correspond to the emitter parallel type semiconductor device 100 as that shown in FIG. 10. In FIG. 14, each plot is approximated by a straight broken line. The straight line shows a relationship between the threshold voltage and the ON voltage when the saturation current is maintained to be comparable with the comparative example. In the present specification, the straight line may be referred to as a first characteristic 210. As shown in FIG. 14, by adjusting the total channel width Z as well as increasing the threshold voltage, the ON voltage can be lowered while maintaining the saturation current amount.

In the semiconductor device 100 of the emitter parallel type, an upper limit value of the total channel width Z can be increased while maintaining a contact area between the contact region 15 and the emitter electrode 52. Accordingly, as shown in FIG. 14, in the semiconductor device 100 of the emitter parallel type, it is possible to increase the total channel width Z and maintain the saturation current amount even when the threshold voltage is set to be higher than that of the semiconductor device 100 of the emitter orthogonal type. By adopting the emitter parallel type for the semiconductor device 100, the ON voltage can be reduced more.

The threshold voltage, the channel resistance, and the ON voltage obtained before adjusting the doping concentration of the base region 14 and the total channel width Z are respectively represented by $V_{th1}$, R1, and V1. In addition, the threshold voltage, the channel resistance, and the ON voltage obtained after adjusting the doping concentration of the base region 14 and the total channel width Z while maintaining the saturation current amount are respectively represented by $V_{th2}$, R2, and V2. The channel resistance is a resistance in the depth direction regarding a region of the base region 14 in contact with the gate trench portion 40, that has been inverted to the N type due to the application of the gate voltage to the gate trench portion 40.

Based on Expression (2), a resistance ratio R2/R1 becomes the following Expression (3).

$$R2/R1 = (Vge - (V_{th2} - 1.5))/(Vge - (V_{th1} - 1.5))$$

Vge is a difference between the first voltage and the second voltage and is, for example, 15 V. In addition, the threshold voltage $V_{th}$ of the semiconductor device 100 decreases roughly −0.1 V by a rise of the temperature of 10° C. In Expression (3), for converting the threshold voltage at room temperature into a threshold voltage in a case where a chip temperature is 175° C., 1.5 V is subtracted from each of the threshold voltages.

An ON voltage decrease amount V1-V2 becomes the following Expression (4).

$$V1 - V2 = V1 - V1(R2/R1) = (1 - (R2/R1)) \times V1 = ((V_{th2} - V_{th1})/(16.5 - V_{th1})) \times V1$$

In Expression (4), Vge is 15 V.

The ON voltage V1 is about 0.4 V when the collector-emitter voltage is 1200 V, for example. Further, the threshold voltage $V_{th1}$ obtained before the adjustment is set to be about 6 V. Thus, an ON voltage decrease amount ΔVon=V1-V2 becomes the following Expression (5).

$$\Delta Von = 3.81 \times 10^{-2}(V_{th} - 6)$$

Note that $V_{th}$ in Expression (5) is the threshold voltage $V_{th2}$ obtained after the adjustment.

The threshold voltage $V_{th}$ of the semiconductor device 100 may be determined such that the ON voltage decrease amount ΔVon becomes 0.1 V or more. In this case, the threshold voltages $V_{th1}$ and $V_{th2}$ satisfy the following expression based on Expression (4).

$$V_{th2} \geq 4.13 + 0.75V_{th1}$$

When $V_{th1}$ is 6 V, $V_{th2}$ becomes 8.6 V or more. The threshold voltage of the semiconductor device 100 may be 8.6 V or more.

The threshold voltage $V_{th}$ of the semiconductor device 100 may be determined such that the ON voltage decrease amount ΔVon becomes 0.15 V or more. In this case, the threshold voltages $V_{th1}$ and $V_{th2}$ satisfy the following expression based on Expression (4).

$$V_{th2} \geq 6.19 + 0.625V_{th1}$$

When $V_{th1}$ is 6 V, $V_{th2}$ becomes 9.9 V or more. The threshold voltage of the semiconductor device 100 may be 9.9 V or more.

A total emitter width per unit area obtained before the adjustment is represented by $W_{E1}$ (cm/cm$^2$), and a total emitter width per unit area obtained after the adjustment while maintaining the saturation current amount is represented by $W_{E2}$ (cm/cm$^2$). The total emitter width $W_E$ is a total length in the Y axis direction regarding a portion of the emitter region 12 that is in contact with the gate trench portion 40 in a unit area.

The total emitter width $W_{E2}$ and the total emitter width $W_{E1}$ become the following Expression (6) based on Expressions (1) and (2).

$$W_{E2} = ((Vge - (V_{th1} - 1.5))^2/(Vge - (V_{th2} - 1.5))^2) \times W_{E1} = ((16.5 - V_{th1})^2/(16.5 - V_{th2})^2) \times W_{E1}$$

In the present example, the total emitter width $W_{E1}$ obtained before the adjustment is $5.8\times10^3$ (cm/cm$^2$).

In this case, the total emitter width $W_{E2}$ becomes the following Expression (7).

$$W_{E2} = (110.25/(16.5 - V_{th2})^2) \times 5.8 \times 10^3 = 6.39 \times 10^5/(16.5 - V_{th2})^2$$

The total emitter width $W_E$ of the semiconductor device 100 may satisfy the following Expression (8).

$$0.9 \times 6.39 \times 10^5/(16.5 - V_{th1})^2 \le W_{E2} \le 1.1 \times 6.39 \times 10^5/(16.5 - V_{th})^2$$

Expression (8) can also be described as the following expression using the gate voltage Vge.

$$0.9 \times 6.39 \times 10^5/(Vge + 1.5 - V_{th})^2 \le W_{E2} \le 1.1 \times 6.39 \times 10^5/(Vge + 1.5 - V_{th})^2$$

Note that the threshold voltage $V_{th}$ satisfies any of the conditions described in the present specification on the threshold voltage $V_{th2}$ obtained after the adjustment. For example, the threshold voltage $V_{th}$ is closer to the first voltage than the intermediate voltage between the first voltage and the second voltage.

As described above, when the threshold voltage $V_{th}$ of the semiconductor device 100 is determined such that the ON voltage decrease amount ΔVon becomes 0.1 V or more, the threshold voltage of the semiconductor device 100 becomes 8.6 V or more. From Expression (6) and the like, when the ON voltage decrease amount ΔVon is 0.1 V or more, the total emitter width $W_E$ may be set to be $1.02\times10^4$ (cm/cm$^2$) or more. In addition, when the ON voltage decrease amount ΔVon is 0.15 V or more, the total emitter width $W_E$ may be set to be $1.47\times10^4$ (cm/cm$^2$) or more.

In the semiconductor device 100 of the present example, a length Lch of a channel (that is, the base region 14) in the depth direction is about 2 μm, the gate dielectric film 42 is a thermal oxide film of silicon, and a thickness of the gate dielectric film 42 is 110 nm. In the semiconductor device 100, the length Lch may be 1.5 μm or more and 2.5 μm or less, and the thickness of the gate dielectric film 42 may be 55 nm or more and 165 nm or less. In the semiconductor device 100, a ratio between the number of gate trench portions 40 and the number of dummy trench portions 30 in the X axis direction may be 1:2. The total emitter width $W_E$ of the semiconductor device 100 may satisfy Expression (8) while satisfying these conditions.

Figure 15:
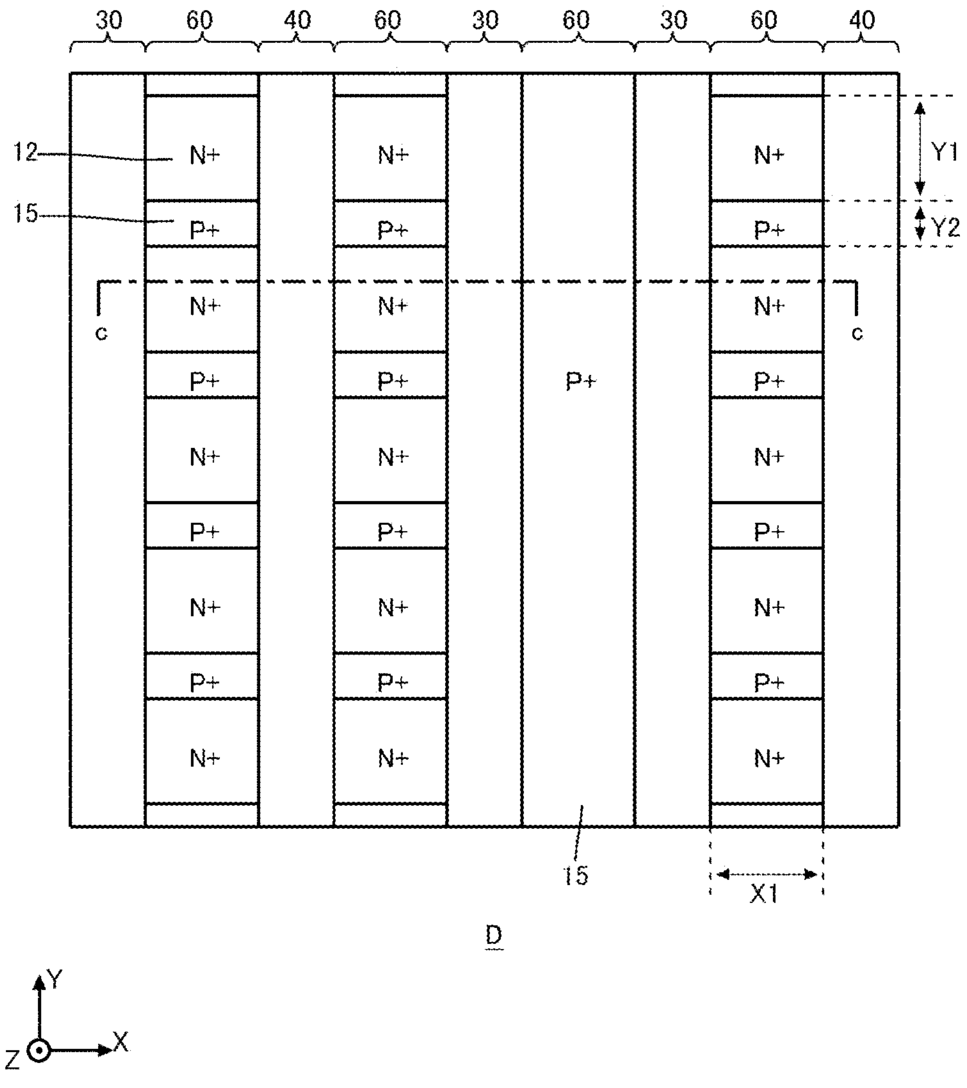
FIG. 15 is a diagram showing another example of the structure of the semiconductor device 100 in the region D according to the example.

FIG. 15 is a diagram showing another example of the structure of the semiconductor device 100 in the region D according to the example. As shown in FIG. 2 and the like, in the semiconductor device 100, the plurality of gate trench portions 40 are arranged next to one another in the X axis direction. In the example of FIG. 2 and the like, one dummy trench portion 30 is provided between two gate trench portions 40 in the X axis direction. In the present example, two dummy trench portions 30 are provided between two gate trench portions 40 in the X axis direction. The mesa portion 60 sandwiched between the two dummy trench portions 30 may be provided with the contact region 15 in place of the emitter region 12. The structure of the mesa portion 60 in contact with the gate trench portion 40 is similar to that of the semiconductor device 100 according to any of the aspects described with reference to FIGS. 1 to 14. FIG. 15 shows the emitter orthogonal type as the arrangement of the emitter regions 12, but the arrangement of the emitter regions 12 may be of the emitter parallel type.

The total emitter width Z is a length of the emitter region 12 in contact with the gate trench portion 40 in the Y axis direction. Accordingly, when the density of the gate trench portions 40 in the X axis direction becomes low, the upper limit value of the total emitter width Z becomes low. For example, regarding a case where a density ratio of the gate trench portions 40 and the dummy trench portions 30 is 1:2 as in FIG. 15 and a case where the density ratio of the gate trench portions 40 and the dummy trench portions 30 is 1:1 as in FIG. 2, the upper limit value of the total emitter width Z in the example of FIG. 15 becomes smaller.

When the upper limit value of the total emitter width Z becomes small, an adjustment width of the saturation current amount by the adjustment of the total emitter width Z becomes small. Thus, if the threshold voltage $V_{th}$ is increased too much, the saturation current amount cannot be maintained even when the total emitter width Z is adjusted. In the structure as shown in FIG. 15 in which the ratio between the number of gate trench portions 40 and the number of dummy trench portions 30 is 1:2, a ratio of a difference between the threshold voltage $V_{th}$ and the second voltage to the difference between the first voltage and the second voltage may be 70% or less. Thus, the ON voltage can be lowered while maintaining the saturation current amount. The threshold voltage $V_{th}$ in this case may be, for example, 10.5 V or less.

In the case of the structure as shown in FIG. 2 in which the ratio between the number of gate trench portions 40 and the number of dummy trench portions 30 is 1:1, the upper limit value of the total emitter width Z becomes large. In this case, the ratio of the difference between the threshold voltage $V_{th}$ and the second voltage to the difference between the first voltage and the second voltage may be 80% or less. Thus, the ON voltage can be lowered while maintaining the saturation current amount. The threshold voltage $V_{th}$ in this case may be, for example, 12 V or less. In the case where the withstand voltage class is a class other than 1200 V, the total emitter width $W_E$ only needs to be adjusted so as to become $W_E=W_{E1200V}$*1200/(withstand voltage class). The (withstand voltage class) indicates a voltage value of the withstand voltage class of the semiconductor device. For example, when the withstand voltage class of the semiconductor device is 1200 V, the (withstand voltage class) is 1200. $W_{E1200V}$ is a total emitter width of the semiconductor device whose withstand voltage class is the class of 1200 V.

Figure 16:
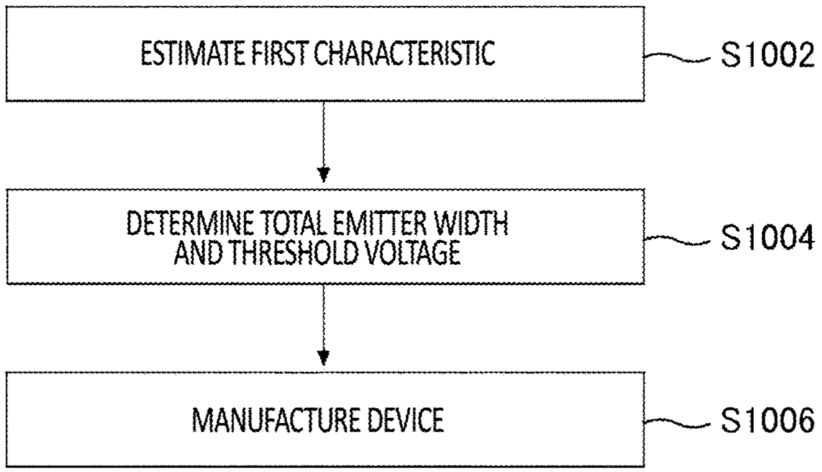
FIG. 16 is a diagram showing a partial process of a manufacturing method of the semiconductor device 100.

FIG. 16 is a diagram showing a partial process of a manufacturing method of the semiconductor device 100. The manufacturing method of the present example includes a characteristics estimation step S1002, a design step S1004, and a manufacturing step S1006.

In the characteristics estimation step S1002, the first characteristic of the semiconductor device 100 is estimated. The first characteristic 210 is a characteristic indicating a relationship between the ON voltage of the transistor portion 70 and the threshold voltage $V_{th}$ of the transistor portion at the setting value of the saturation current. For example, the first characteristic 210 is a characteristic indicated by the straight broken line in FIG. 14. In the characteristics estimation step S1002, the first characteristic 210 is estimated based on setting values of the saturation current Isat of the transistor portion 70, the capacitance Cox of the gate dielectric film 42, and the channel length Lch that is a length by which the base region 14 is in contact with the gate trench portion 40 in the depth direction of the semiconductor substrate 10. In the characteristics estimation step S1002, the voltage value of the first voltage and the voltage value of the second voltage may be acquired.

The setting value of the saturation current Isat may be determined according to a specification that the semiconductor device 100 is to satisfy. The setting value of the capacitance Cox of the gate dielectric film 42 may be calculated from the material and shape including a thickness of the gate dielectric film 42 of the semiconductor device 100 to be manufactured. The setting value of the channel length Lch may be calculated from the thickness of the base region 14 in contact with the gate trench portion 40 in the depth direction in the semiconductor device 100 to be manufactured.

In the characteristics estimation step S1002, the first characteristic 210 may be estimated using Expression (1). In the characteristics estimation step S1002, the first voltage (for example, 15 V) may be used as the gate voltage Vge in Expression (1).

In the design step S1004, the ON voltage and threshold voltage of the semiconductor device 100 are determined based on the first characteristic 210. In the design step S1004, after determining the ON voltage that the semiconductor device 100 is to satisfy, the threshold voltage corresponding to the ON voltage may be determined based on the first characteristic 210. In the design step S1004, a range of the ON voltage that the semiconductor device 100 may possibly take may be determined based on which of the emitter orthogonal type and the emitter parallel type the semiconductor device 100 is. In the design step S1004, the ON voltage may be determined within the range. In another example, in the design step S1004, after determining the threshold voltage that the semiconductor device 100 is to satisfy, the ON voltage corresponding to the threshold voltage may be determined based on the first characteristic 210.

In the manufacturing step S1006, the semiconductor device 100 is manufactured so as to satisfy the determined ON voltage and threshold voltage. In the manufacturing step S1006, the total channel width Z is determined based on the ON voltage. The relationship between the ON voltage and the total channel width Z may be calculated by a simulation, or may be premeasured experimentally. The total channel width $W_E$ per unit area may be determined so as to satisfy Expression (8). In the manufacturing step S1006, the doping concentration Db of the base region 14 is determined based on the threshold voltage. The relationship between the threshold voltage and the doping concentration Db of the base region 14 may be calculated by a simulation, or may be premeasured experimentally. In the manufacturing step S1006, the semiconductor device 100 is manufactured so as to satisfy the determined total channel width Z and doping concentration Db. Thus, it is possible to manufacture the semiconductor device 100 in which the ON voltage is lowered while the saturation current is maintained or lowered.

While the present invention has been described above by using the embodiments, the technical scope of the present invention is not limited to the scope of the above-described embodiments. It is apparent to persons skilled in the art that various alterations or improvements can be made to the above-described embodiments. It is also apparent from description of the claims that the embodiments to which such alterations or improvements are made can be included in the technical scope of the present invention.

It should be noted that the operations, procedures, steps, stages, and the like of each process performed by an apparatus, system, program, and method shown in the claims, embodiments, or diagrams can be realized in any order as long as the order is not indicated by "prior to," "before," or the like and as long as the output from a previous process is not used in a later process. Even if the operation flow is described using phrases such as "first" or "next" for the sake of convenience in the claims, specification, or drawings, it does not necessarily mean that the process must be performed in this order.

What is claimed is:

1. A semiconductor device comprising a semiconductor substrate which has an upper surface and a lower surface and is provided with a drift region of a first conductivity type, and a portion which operates as a transistor, wherein the transistor includes:

a gate trench portion which includes a gate conductive portion to which a gate voltage is applied and a gate dielectric film enclosing the gate conductive portion;

an emitter region of the first conductivity type which is provided to be exposed on the upper surface of the semiconductor substrate and is in contact with the gate trench portion; and a base region of a second conductivity type which is provided between the emitter region and the drift region and is in contact with the gate trench portion, wherein as the gate voltage, a first voltage is applied to the gate trench portion when turning the transistor to an on state, and a threshold voltage at which the transistor transits from an off state to the on state in an ambient temperature of 25° C. is larger than a half of the first voltage.

2. The semiconductor device according to claim 1, wherein the threshold voltage is 55% or more of the first voltage.

3. The semiconductor device according to claim 1, wherein the threshold voltage is 60% or more of the first voltage.

4. The semiconductor device according to claim 1, wherein the threshold voltage is 70% or more of the first voltage.

5. The semiconductor device according to claim 1, wherein a second voltage is applied to the gate trench portion when turning the transistor to the off state, and the threshold voltage is closer to the first voltage than an intermediate voltage between the first voltage and the second voltage.

6. The semiconductor device according to claim 5, wherein a ratio of a difference between the threshold voltage and the second voltage to a difference between the first voltage and the second voltage is 55% or more.

7. The semiconductor device according to claim 5, wherein a ratio of a difference between the threshold voltage and the second voltage to a difference between the first voltage and the second voltage is 60% or more.

8. The semiconductor device according to claim 5, wherein a ratio of a difference between the threshold voltage and the second voltage to a difference between the first voltage and the second voltage is 70% or less.

9. The semiconductor device according to claim 5, wherein the second voltage is 0 V.

10. The semiconductor device according to claim 5, wherein the second voltage is −15 V.

11. The semiconductor device according to claim 5, wherein when a difference between the first voltage and the second voltage is represented by Vge (V), a total emitter width that is a total length of a portion where the emitter region is in contact with the gate trench portion in a unit area is represented by $W_E$ (cm/cm$^2$), and the threshold voltage is represented by $V_{th}$ (V), the total emitter width $W_E$ satisfies an expression below:

$$0.9\times 6.39\times 10^5/(Vge+1.5-V_{th})^2 \le W_E \le 1.1\times 6.39\times 10^5/(Vge+1.5-V_{th})^2.$$

12. The semiconductor device according to claim 1, wherein a plurality of the gate trench portions are arranged next to one another, and two dummy trench portions are arranged between two of the gate trench portions.

13. The semiconductor device according to claim 1, wherein a longitudinal direction of the gate trench portion on the upper surface of the semiconductor substrate is a first direction, and a length of the emitter region in the first direction is larger than a length thereof in a second direction orthogonal to the first direction.

14. The semiconductor device according to claim 1, further comprising:

a contact region of the second conductivity type which is provided to be exposed on the upper surface of the semiconductor substrate and is in contact with the gate trench portion, wherein a longitudinal direction of the gate trench portion on the upper surface of the semiconductor substrate is a first direction, the emitter region and the contact region are arranged alternately along the first direction at a position in contact with the gate trench portion, and a length of the emitter region in the first direction is larger than a length of the contact region in the first direction at a position in contact with the gate trench portion.

15. The semiconductor device according to claim 14, wherein the length of the emitter region in the first direction is equal to or more than 2 times the length of the contact region in the first direction at the position in contact with the gate trench portion.

16. A semiconductor module, comprising:

the semiconductor device according to claim 1; and a control portion which applies the gate voltage to the semiconductor device.

17. The semiconductor module according to claim 16, wherein a second voltage is applied to the gate trench portion when turning the transistor to the off state, and the threshold voltage is closer to the first voltage than an intermediate voltage between the first voltage and the second voltage.

18. A manufacturing method of a semiconductor device including a semiconductor substrate which has an upper surface and a lower surface and is provided with a drift region of a first conductivity type, and a portion which operates as a transistor, wherein the transistor includes a gate trench portion which includes a gate conductive portion to which a gate voltage is applied and a gate dielectric film enclosing the gate conductive portion, a longitudinal direction of the gate trench portion being a first direction, an emitter region of the first conductivity type which is provided to be exposed on the upper surface of the semiconductor substrate and is in contact with the gate trench portion, and a base region of a second conductivity type which is provided between the emitter region and the drift region and is in contact with the gate trench portion, and the manufacturing method comprises:

estimating, based on setting values of a saturation current of the transistor, a capacitance of the gate dielectric film, and a channel length that is a length by which the base region is in contact with the gate trench portion in a depth direction of the semiconductor substrate, a first characteristic that indicate a relationship between an ON voltage of the transistor and a threshold voltage of the transistor at the setting value of the saturation current;

determining the ON voltage and the threshold voltage based on the first characteristic; and manufacturing the semiconductor device such that the ON voltage and the threshold voltage that have been determined are satisfied.

19. The manufacturing method according to claim 18, comprising:

determining the ON voltage and determining the threshold voltage corresponding to the ON voltage based on the first characteristic.

20. The manufacturing method according to claim 18, comprising:

determining the threshold voltage and determining the ON voltage corresponding to the threshold voltage based on the first characteristic.

* * * * *